(12) United States Patent
Spory

(10) Patent No.: US 9,824,948 B2
(45) Date of Patent: Nov. 21, 2017

(54) INTEGRATED CIRCUIT WITH PRINTED BOND CONNECTIONS

(71) Applicant: Global Circuit Innovations Incorporated, Colorado Springs, CO (US)

(72) Inventor: Erick Merle Spory, Colorado Springs, CO (US)

(73) Assignee: Global Circuit Innovations Incorporated, Colorado Springs, CO (US)

( * ) Notice: Subject to any disclaimer, the term of this patent is extended or adjusted under 35 U.S.C. 154(b) by 35 days.

(21) Appl. No.: 14/600,733

(22) Filed: Jan. 20, 2015

(65) Prior Publication Data

US 2016/0181171 A1 Jun. 23, 2016

Related U.S. Application Data

(60) Division of application No. 14/142,823, filed on Dec. 28, 2013, which is a continuation-in-part of
(Continued)

(51) Int. Cl.
*H01L 23/48* (2006.01)
*H01L 23/52* (2006.01)
(Continued)

(52) U.S. Cl.
CPC .......... *H01L 23/20* (2013.01); *H01L 21/4803* (2013.01); *H01L 21/4817* (2013.01); *H01L 21/50* (2013.01); *H01L 23/04* (2013.01); *H01L 23/26* (2013.01); *H01L 23/49513* (2013.01); *H01L 23/49541* (2013.01); *H01L 23/49861* (2013.01); *H01L 24/24* (2013.01); *H01L 24/25* (2013.01); *H01L 24/27* (2013.01);
(Continued)

(58) Field of Classification Search
CPC .. H01L 21/4803; H01L 21/4817; H01L 21/50
USPC ........................................... 438/118; 257/692
See application file for complete search history.

(56) References Cited

U.S. PATENT DOCUMENTS 4,426,769 A 1/1984 Grabbe
4,622,433 A 11/1986 Frampton
(Continued)

FOREIGN PATENT DOCUMENTS

WO WO2011-101272 A1 8/2011

OTHER PUBLICATIONS

Wikipedia "3D Printing" reference, downloaded Jan. 12, 2015 2.
(Continued)

*Primary Examiner* — Olik Chaudhuri
*Assistant Examiner* — Wilner Jean Baptiste
(74) *Attorney, Agent, or Firm* — Thomas J. Lavan

(57) ABSTRACT

A packaged integrated circuit is provided. The packaged integrated circuit includes a die, a package including a base, a lid, and a plurality of package leads, and die attach adhesive for securing the die to the package base. the die includes a plurality of die pads. The die is secured to the base with the die attach adhesive. After the die is secured to the base, at least one of the plurality of die pads is electrically connected to at least one of the plurality of package leads with a printed bond connection. After printing the bond connection, the lid is sealed to the base.

10 Claims, 17 Drawing Sheets

Packaged integrated circuit using printed bond conductors

Related U.S. Application Data application No. 13/785,959, filed on Mar. 5, 2013, now abandoned, which is a continuation-in-part of application No. 13/623,603, filed on Sep. 20, 2012, which is a continuation of application No. 13/283,293, filed on Oct. 27, 2011, now abandoned.

(51) Int. Cl.

| | | |
|---|---|---|
| *H01L 23/20* | (2006.01) | |
| *H01L 23/00* | (2006.01) | |
| *H01L 23/26* | (2006.01) | |
| *H01L 21/50* | (2006.01) | |
| *H01L 21/48* | (2006.01) | |
| *H01L 23/04* | (2006.01) | |
| *H01L 23/495* | (2006.01) | |
| *H01L 23/498* | (2006.01) | |
| *H01L 23/10* | (2006.01) | |

(52) U.S. Cl.
CPC ............ *H01L 24/29* (2013.01); *H01L 24/32* (2013.01); *H01L 24/82* (2013.01); *H01L 24/83* (2013.01); *H01L 23/10* (2013.01); *H01L 23/564* (2013.01); *H01L 2224/245* (2013.01); *H01L 2224/24011* (2013.01); *H01L 2224/24051* (2013.01); *H01L 2224/24175* (2013.01); *H01L 2224/25171* (2013.01); *H01L 2224/2731* (2013.01); *H01L 2224/2919* (2013.01); *H01L 2224/29124* (2013.01); *H01L 2224/29144* (2013.01); *H01L 2224/29147* (2013.01); *H01L 2224/32225* (2013.01); *H01L 2224/32245* (2013.01); *H01L 2224/82102* (2013.01); *H01L 2224/82103* (2013.01); *H01L 2224/82214* (2013.01); *H01L 2224/82815* (2013.01); *H01L 2224/838* (2013.01); *H01L 2224/8385* (2013.01); *H01L 2224/83192* (2013.01); *H01L 2224/92247* (2013.01); *H01L 2924/00015* (2013.01); *H01L 2924/12042* (2013.01); *H01L 2924/14* (2013.01); *H01L 2924/157* (2013.01); *H01L 2924/15787* (2013.01); *H01L 2924/15788* (2013.01); *H01L 2924/181* (2013.01); *H01L 2924/3656* (2013.01); *H01L 2924/3861* (2013.01)

(56) References Cited

U.S. PATENT DOCUMENTS

| | | | |
|---|---|---|---|
| 5,064,782 A | | 11/1991 | Nishiguchi |
| 5,219,794 A | | 6/1993 | Satoh |
| 5,243,756 A | * | 9/1993 | Hamburgen et al. ........... 29/841 |
| 5,517,127 A | | 5/1996 | Bergeron |
| 5,598,031 A | | 1/1997 | Groover et al. |
| 5,783,464 A | | 7/1998 | Burns |
| 5,783,868 A | | 7/1998 | Galloway |
| 5,847,467 A | * | 12/1998 | Wills ................... H01L 23/4334 257/789 |
| 5,936,758 A | | 8/1999 | Fisher et al. |
| 6,100,108 A | * | 8/2000 | Mizuno et al. ................ 438/51 |
| 6,100,581 A | * | 8/2000 | Wakefield et al. ........... 257/692 |
| 6,169,331 B1 | | 1/2001 | Manning |
| 6,429,028 B1 | | 8/2002 | Young |
| 6,472,725 B1 | | 10/2002 | Stroupe |
| 7,759,800 B2 | | 7/2010 | Rigg et al. |
| 7,833,880 B2 | | 11/2010 | Rizzi |
| 8,421,227 B2 | | 4/2013 | Lin |
| 2001/0019176 A1 | | 9/2001 | Ahiko et al. |
| 2002/0084528 A1 | | 7/2002 | Kim et al. |
| 2002/0182782 A1 | * | 12/2002 | Farnworth ............ B29C 70/72 438/127 |
| 2003/0127423 A1 | * | 7/2003 | Dlugokecki .......... H01L 21/485 216/14 |
| 2004/0006150 A1 | | 1/2004 | Murray et al. |
| 2004/0040855 A1 | | 3/2004 | Batinovich |
| 2004/0056072 A1 | | 3/2004 | Chapman et al. |
| 2005/0057883 A1 | * | 3/2005 | Bolken ............... H01L 21/4803 361/301.3 |
| 2005/0085578 A1 | | 4/2005 | Iguchi |
| 2005/0285250 A1 | | 12/2005 | Jeong |
| 2006/0068595 A1 | | 3/2006 | Seliger et al. |
| 2006/0166406 A1 | | 7/2006 | Lin |
| 2007/0007661 A1 | | 1/2007 | Burgess |
| 2007/0259470 A1 | | 11/2007 | Quenzer et al. |
| 2007/0295456 A1 | | 12/2007 | Gudeman |
| 2008/0124547 A1 | | 5/2008 | O et al. |
| 2008/0230922 A1 | * | 9/2008 | Mochizuki .......... H01L 21/6835 257/777 |
| 2009/0151972 A1 | | 6/2009 | Potter |
| 2009/0160047 A1 | * | 6/2009 | Otsuka .................... H01L 21/56 257/704 |
| 2010/0007367 A1 | | 1/2010 | Spielberger et al. |
| 2010/0079035 A1 | | 4/2010 | Matsuzawa et al. |
| 2010/0140811 A1 | | 6/2010 | Leal et al. |
| 2010/0200262 A1 | | 8/2010 | Mahapatra et al. |
| 2010/0246152 A1 | | 9/2010 | Lin et al. |
| 2010/0314754 A1 | | 12/2010 | Zhang |
| 2011/0215449 A1 | * | 9/2011 | Camacho et al. ............ 257/659 |
| 2011/0298137 A1 | | 12/2011 | Pagaila et al. |
| 2012/0177853 A1 | | 7/2012 | Gruenwald |
| 2012/0217643 A1 | | 8/2012 | Pagaila |
| 2013/0207248 A1 | | 8/2013 | Bensoussan et al. |
| 2014/0252584 A1 | | 9/2014 | Spory |
| 2016/0225686 A1 | | 8/2016 | Spory |

OTHER PUBLICATIONS

Wikipedia "Screen printing" reference, downloaded Jan. 12, 2015.
Official Action for U.S. Appl. No. 13/623,603, dated Dec. 9, 2014.
Official Action for U.S. Appl. No. 13/785,959, dated Jan. 5, 2015.
Official Action for U.S. Appl. No. 14/142,823, dated Jan. 5, 2015.
Getters—molecular scavengers for packaging, Dr. Ken Gilleo and Steve Corbett, HDI Jan. 2001, www.hdi-online.com, 4 pages.
Cookson Group STAYDRY SD1000 High Temperature Moisture Getter data sheet, Cookson Group, May 30, 2011, 1 page.
Wikipdia "Getter", retrieved May 30, 2011, http://en.wikipedia.org/wiki/Getter.
Wikipdia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
sPRO 125 and sPRO 250 Direct Metal SLM Production Printer datasheet, 3DSystems, Part No. 70743, Issue Date Apr. 10, 2012.
Official Action for U.S. Appl. No. 13/623,603, dated Apr. 16, 2015.
Official Action for U.S. Appl. No. 13/785,959, dated Apr. 16, 2015.
Official Action for U.S. Appl. No. 14/142,823, dated May 11, 2015.
Wikipedia "3D Printing" reference, downloaded Jan. 12, 2015, https://en.wikipedia.org/wiki/3D_printing.
Wikipedia "Screen printing" reference, downloaded Jan. 12, 2015, https://en.wikipedia.org/wiki/Screen_printing.
Official Action for U.S. Appl. No. 14/142,823, dated Oct. 9, 2015.
Official Action for U.S. Appl. No. 14/565,626, dated Aug. 28, 2015.
Official Action for U.S. Appl. No. 14/600,691, dated Aug. 10, 2015.
Official Action for U.S. Appl. No. 13/623,603, dated Aug. 14, 2015.
Wikipedia "Ball Bonding", downloaded Apr. 11, 2016.
Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.

(56) References Cited

OTHER PUBLICATIONS

Official Action for U.S. Appl. No. 13/623,603, dated Apr. 29, 2016.
Official Action for U.S. Appl. No. 14/142,823, dated Feb. 29, 2016.
Official Action for U.S. Appl. No. 14/600,691, dated Feb. 19, 2016.
Official Action for U.S. Appl. No. 13/623,603, dated Aug. 24, 2016.
Official Action for U.S. Appl. No. 14/600,691, dated Jul. 29, 2016.
Official Action for U.S. Appl. No. 14/142,823, dated Jul. 28, 2016.
Notice of Allowance for U.S. Appl. No. 14/600,691, dated Jun. 6, 2017.
Official Action for U.S. Appl. No. 13/623,603, dated Apr. 11, 2017.
Official Action for U.S. Appl. No. 15/088,822, dated Mar. 24, 2017.
Official Action for U.S. Appl. No. 14/600,691, dated Dec. 27, 2016.

* cited by examiner

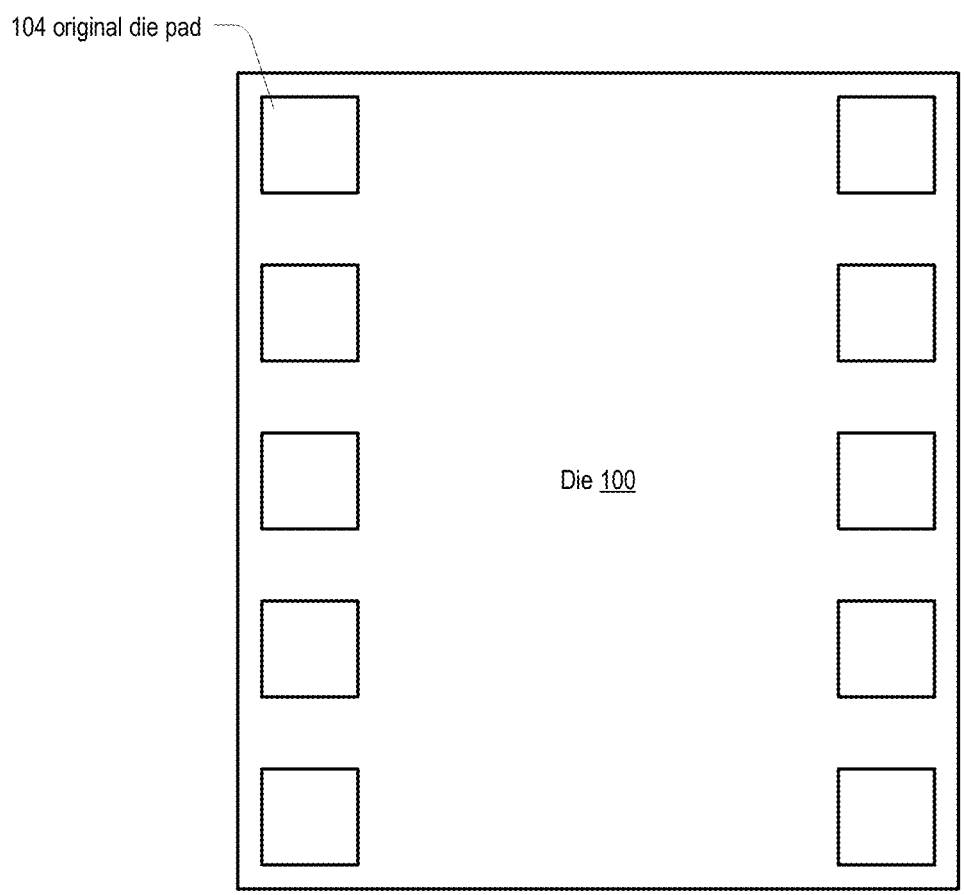
Fig. 1  Die with bond pads

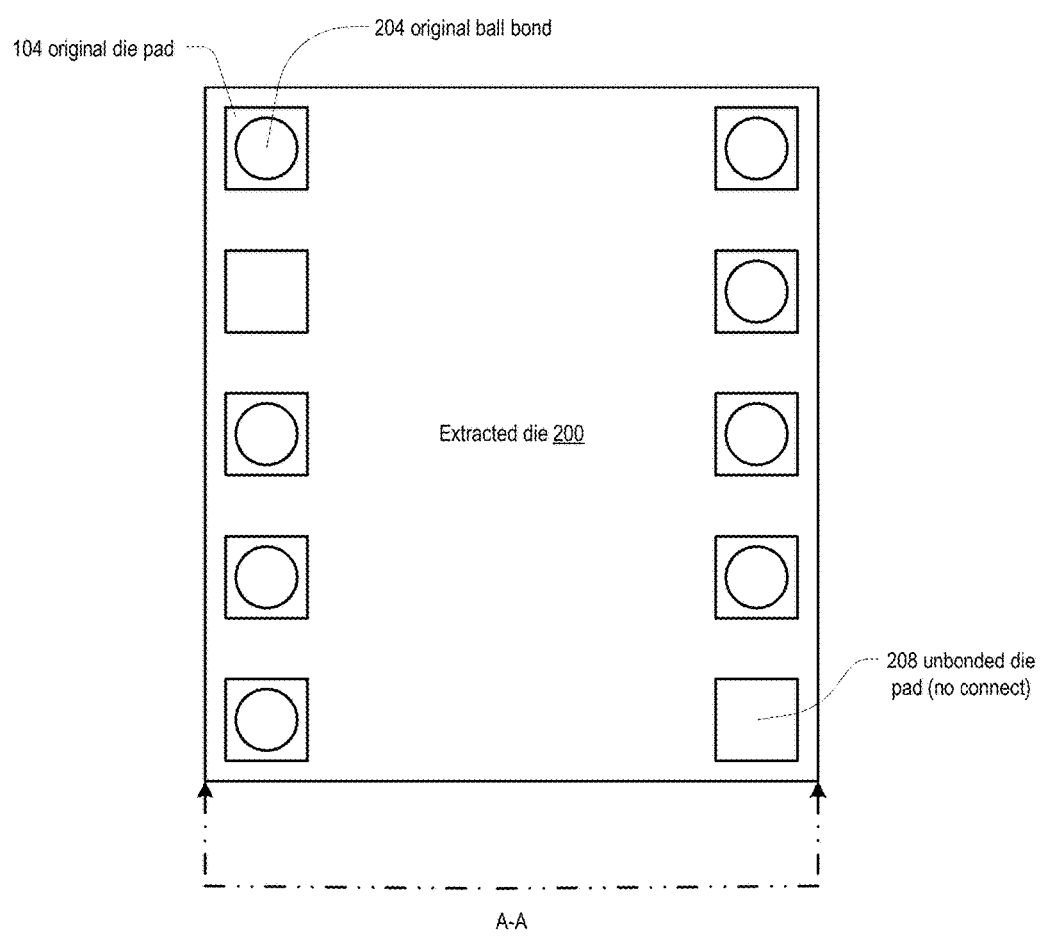
Fig. 2 Extracted die with bond pads and ball bonds

*Fig. 3a Extracted die section A-A*
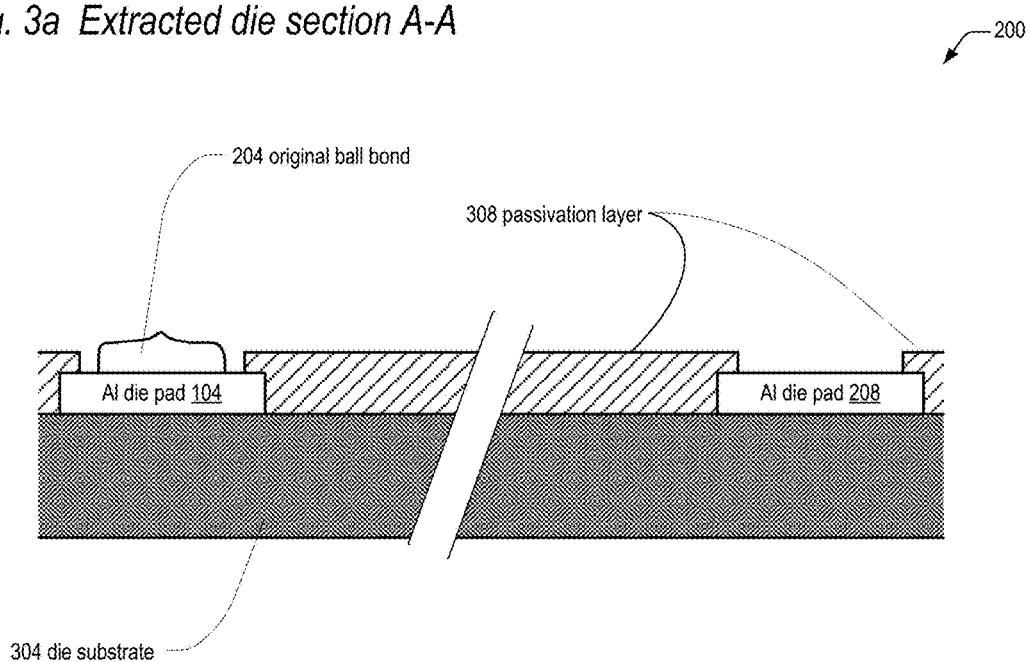
*Fig. 3b Extracted die section A-A after bond conductor printing process*
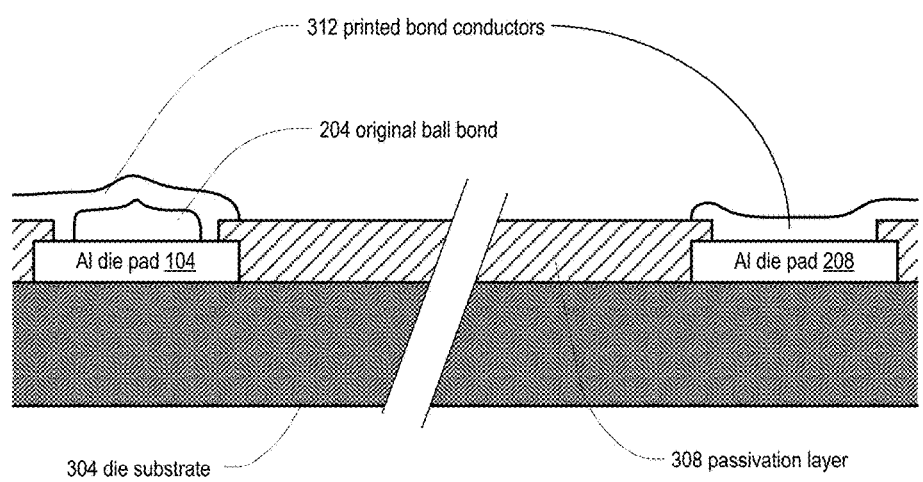

*Fig. 4a Conventional assembled package base using bond wires*
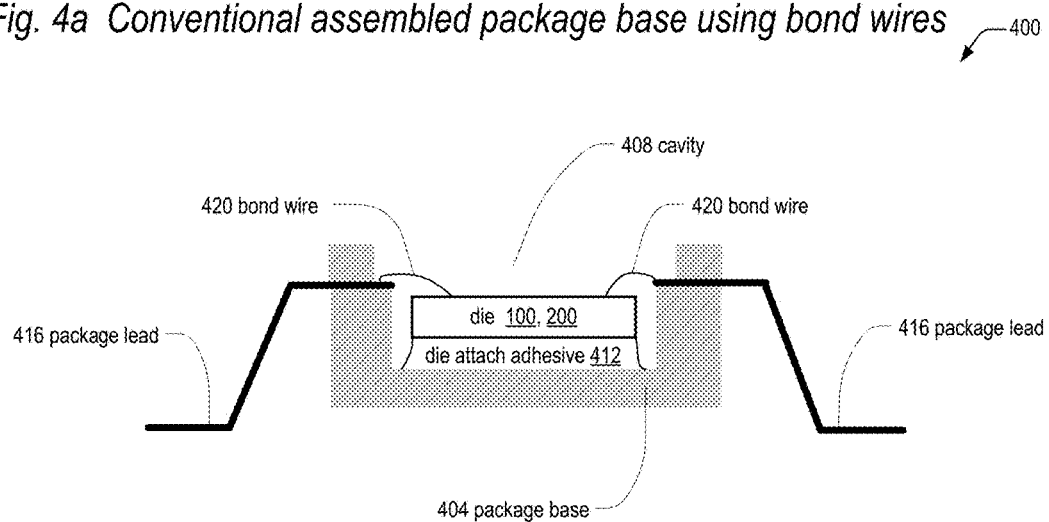
*Fig. 4b Conventional packaged integrated circuit using bond wires*
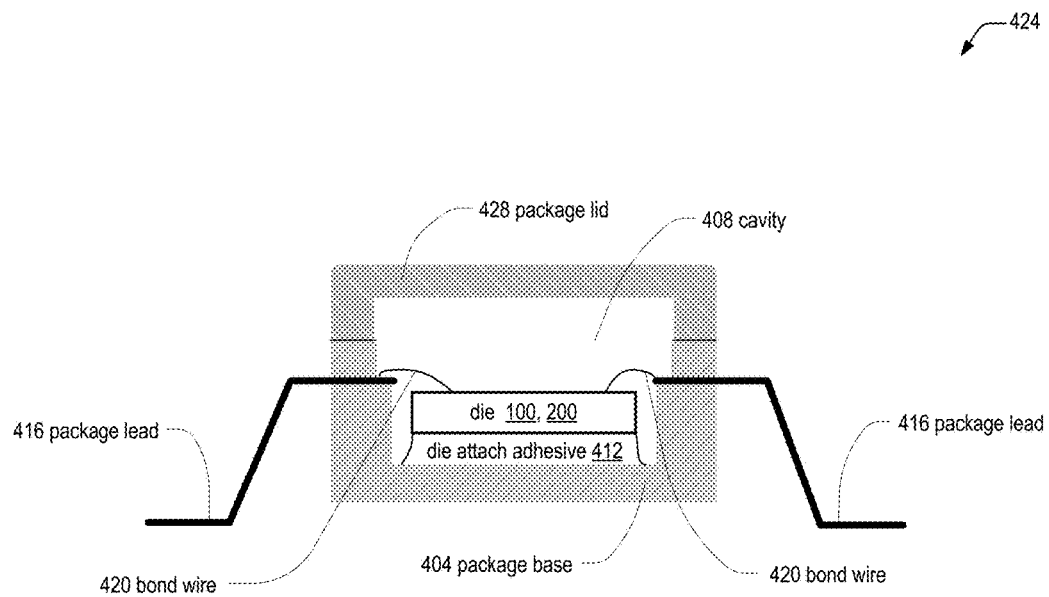

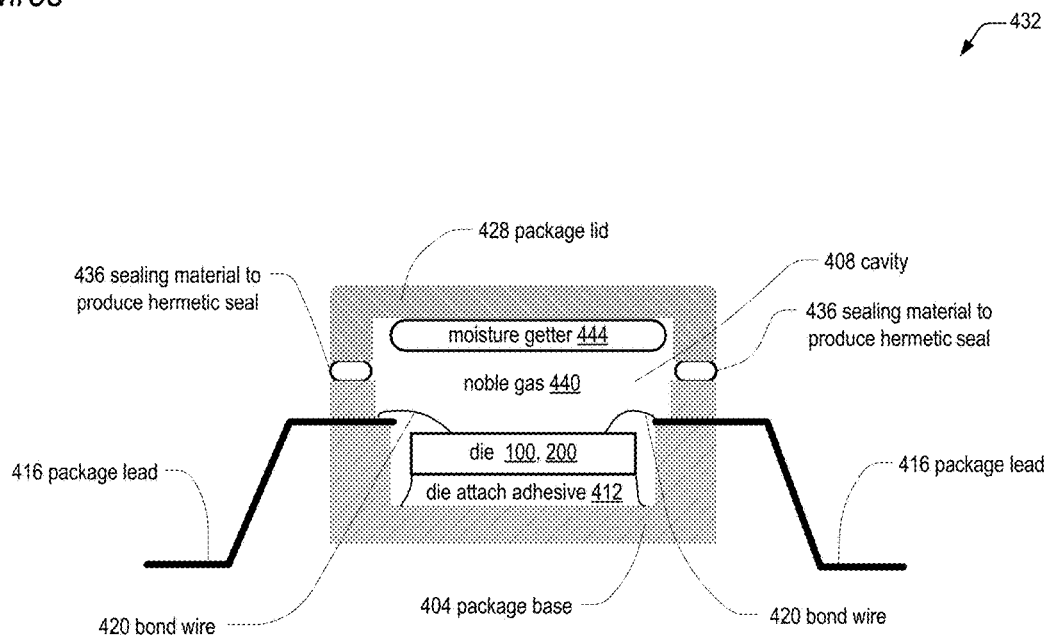
Fig. 4c Conventional packaged hermetic integrated circuit using bond wires

*Fig. 5a Assembled package base before bond printing*
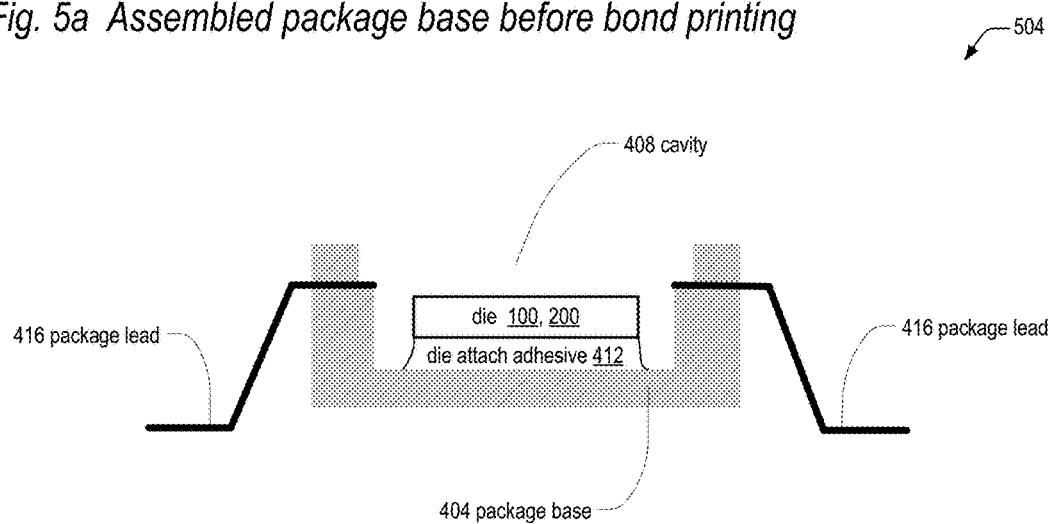
*Fig. 5b Assembled package base after bond insulator printing*
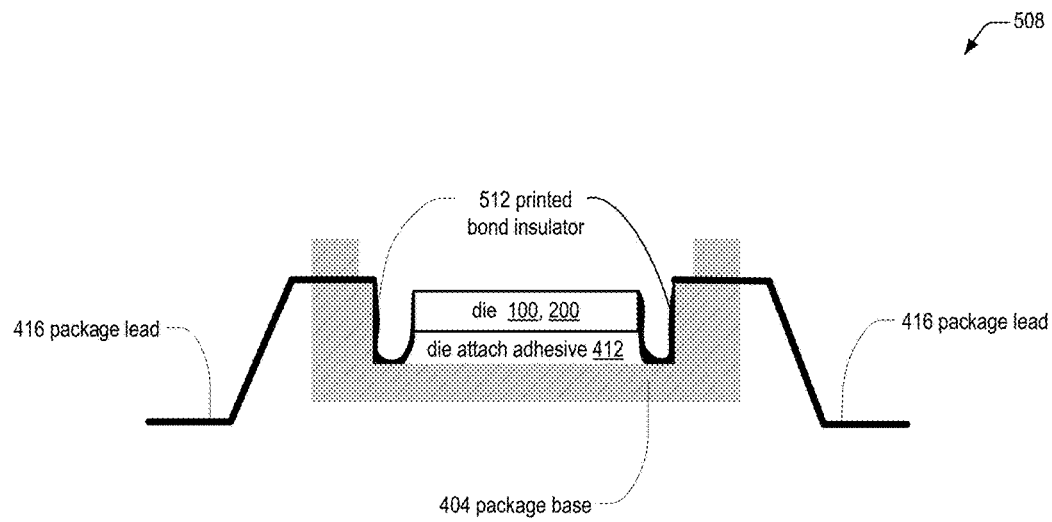

*Fig. 5c Assembled package base after bond conductor printing*
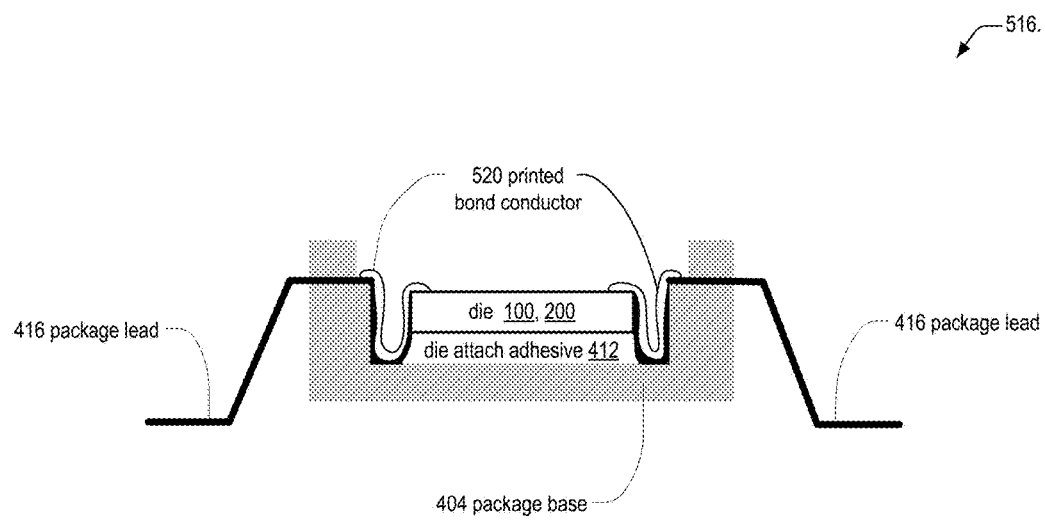
*Fig. 5d Packaged integrated circuit using printed bond conductors*
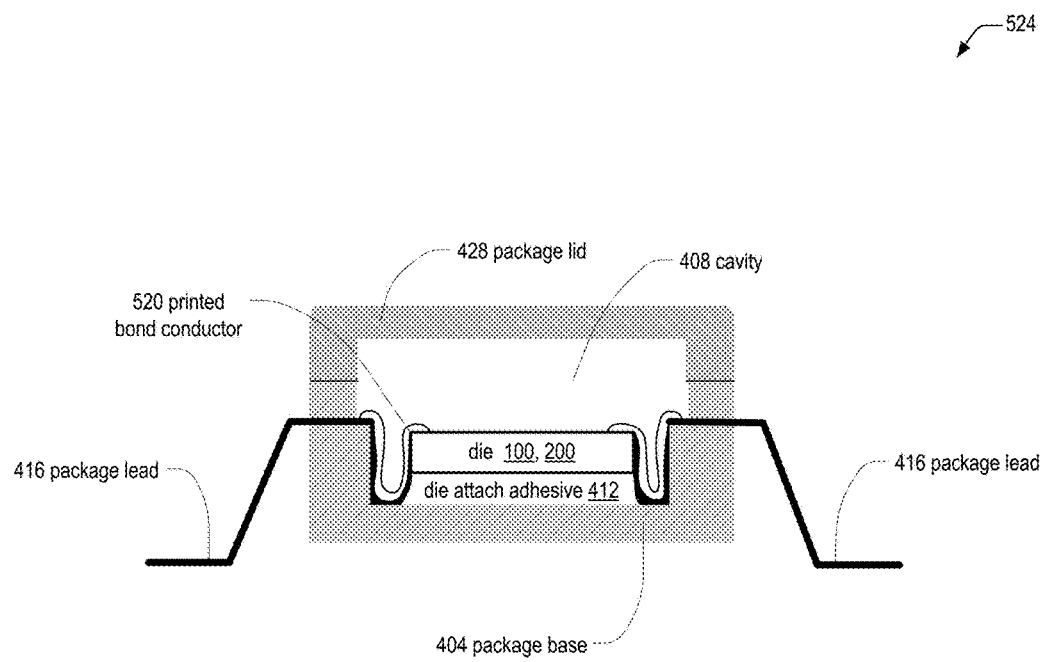

Fig. 5e Packaged hermetic integrated circuit using printed bond conductors
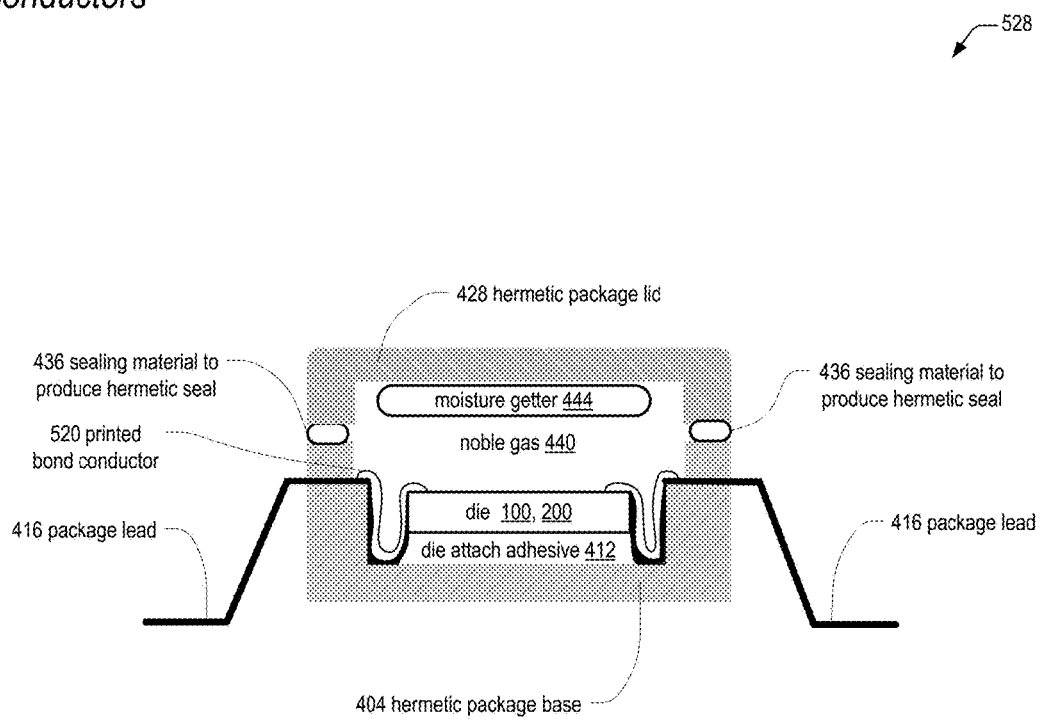

Fig. 6a Top view of die attached to package base
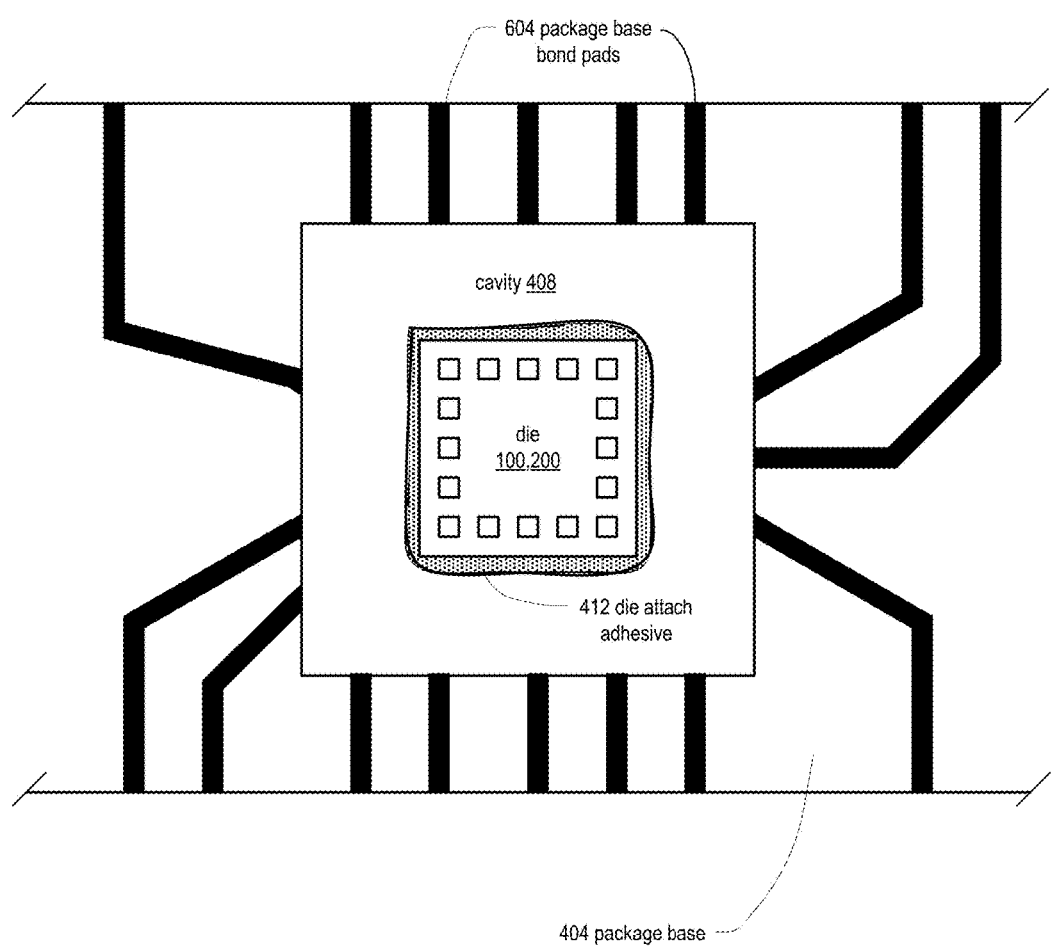

Fig. 6b Top view of printed bond insulators
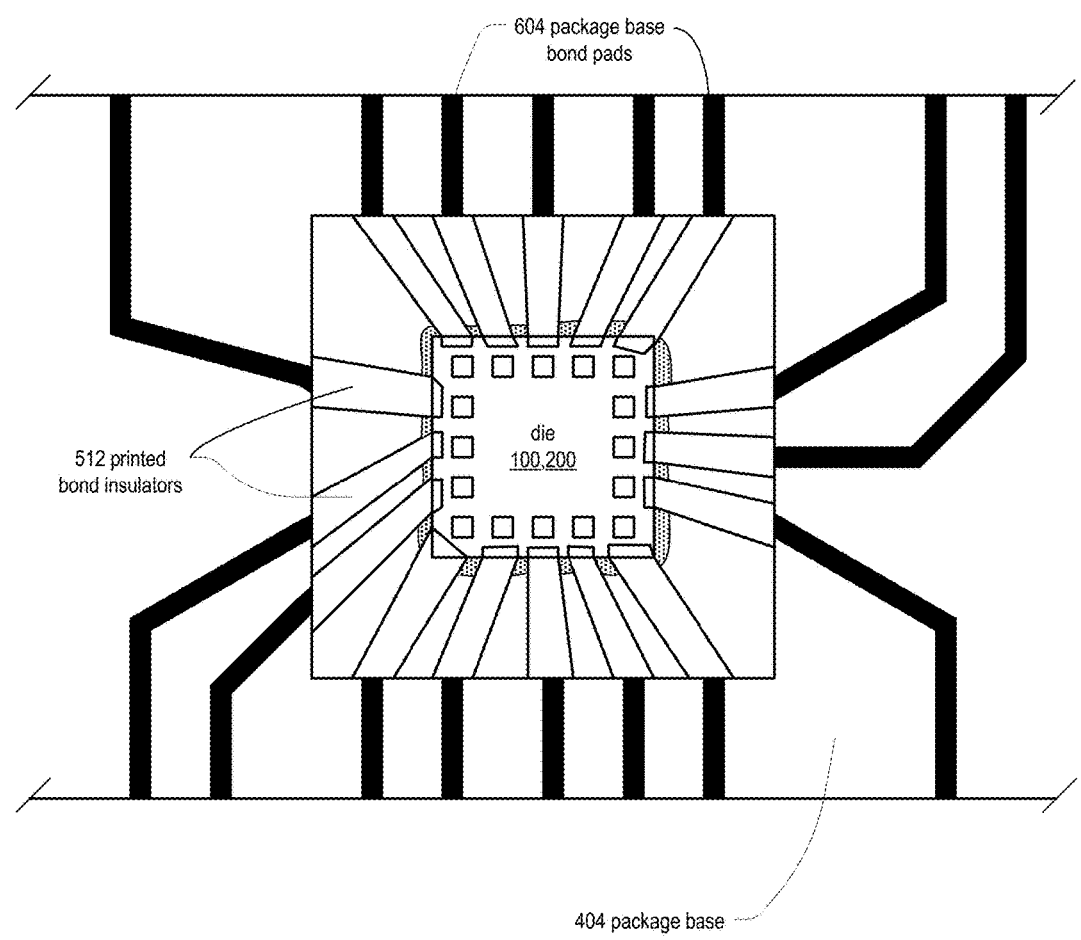

*Fig. 6c Top view of printed bond conductors*
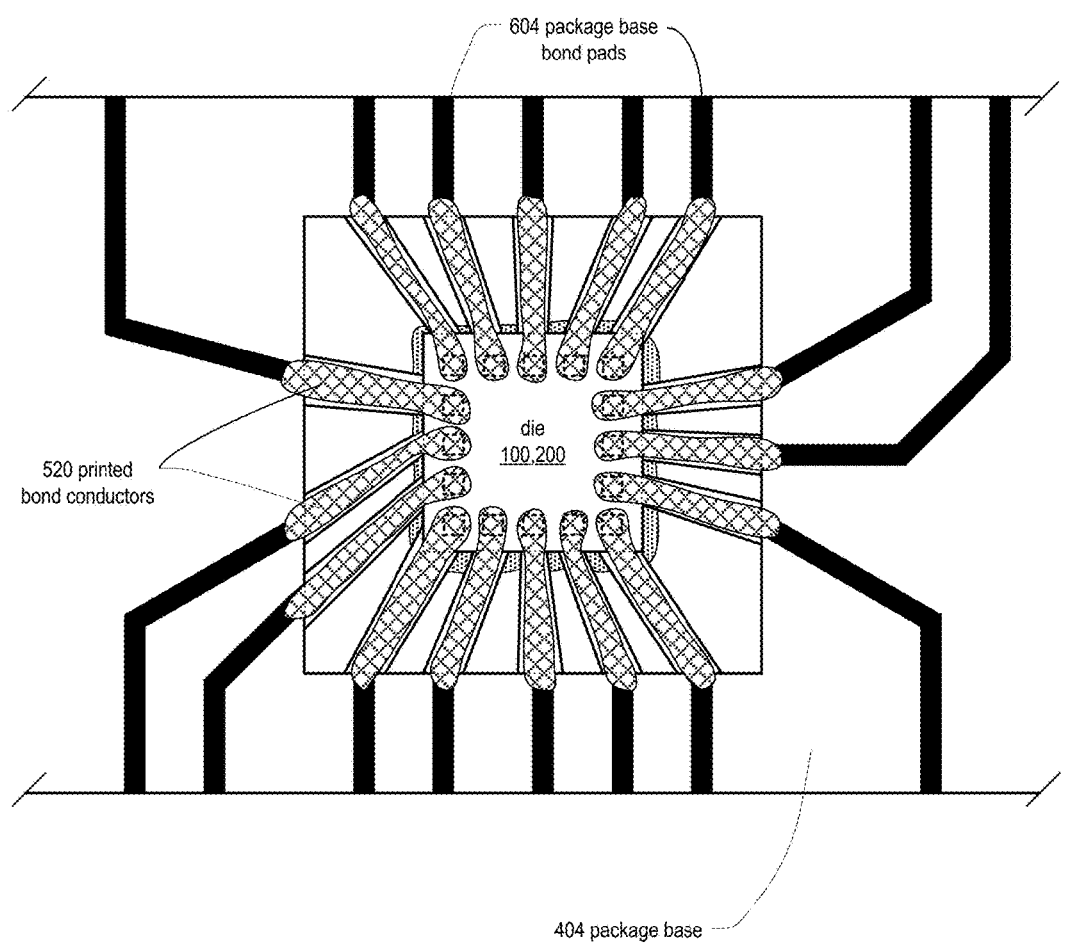

*Fig. 7 Insulating and conducting material spray with 3D printer*
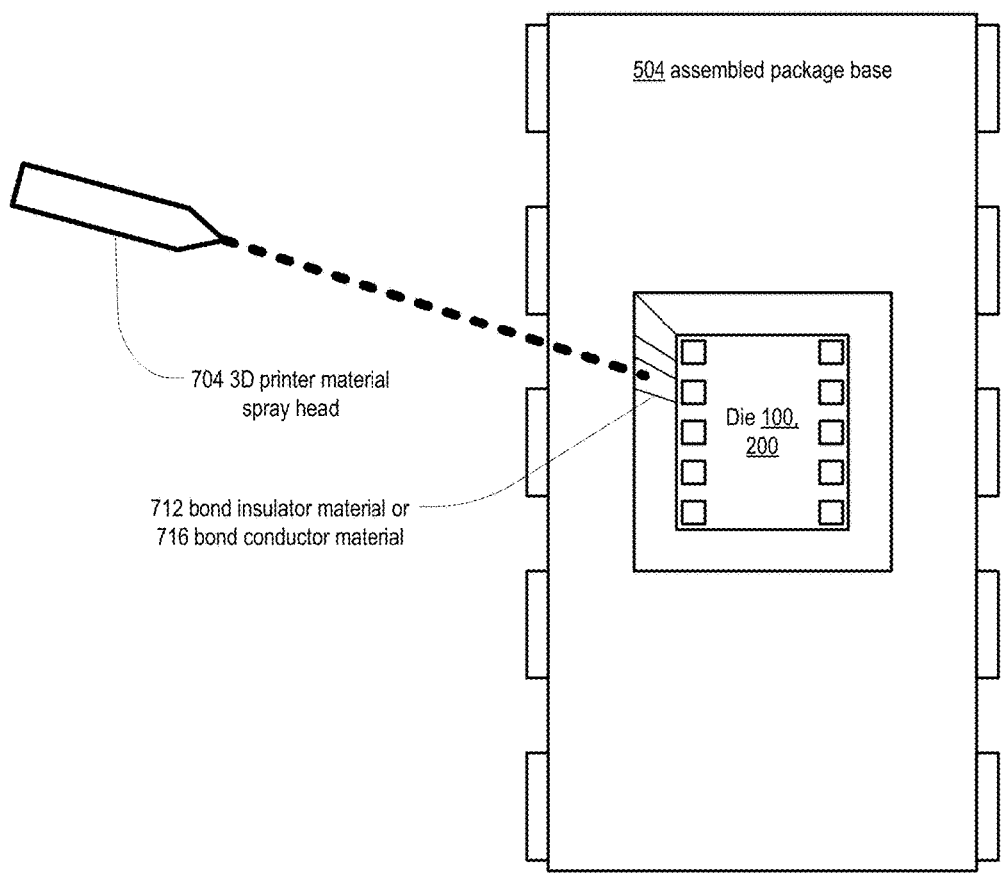

Fig. 8 Sintering process to form printed bond insulator or printed bond conductor
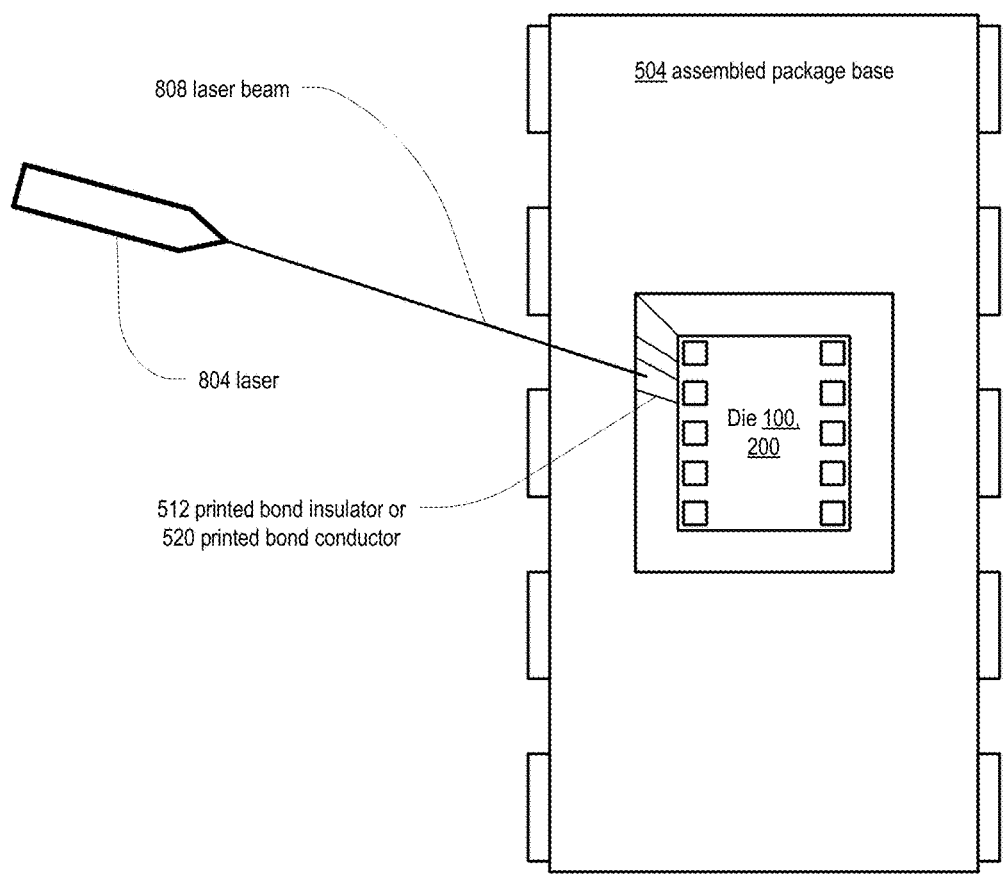

Fig. 9 Assembly method for integrated circuit
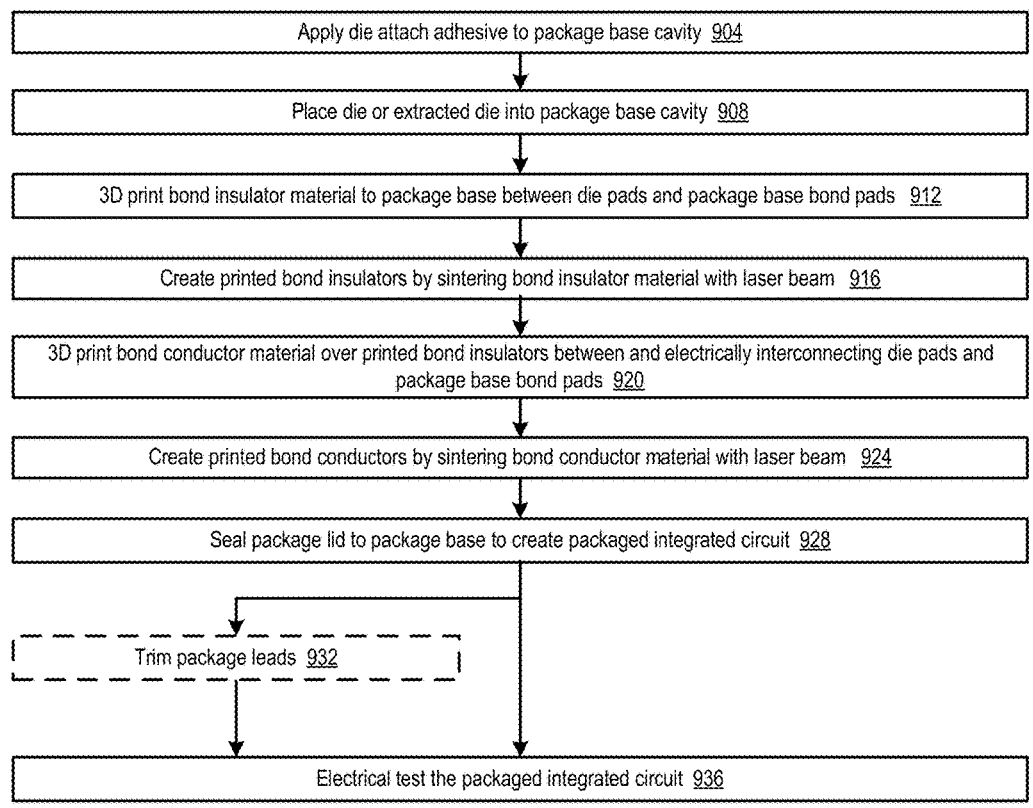

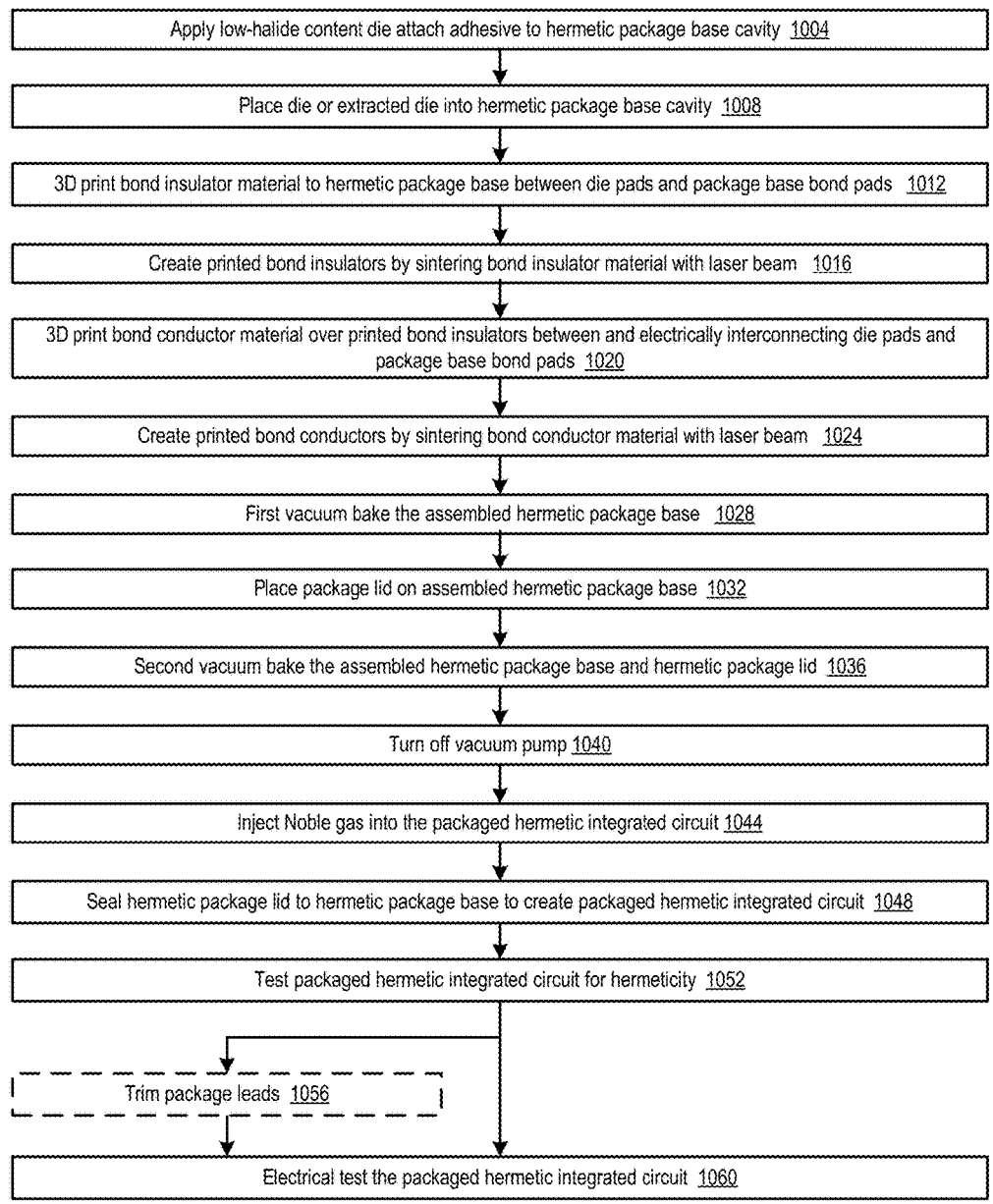
*Fig. 10 Assembly method for repackaged environmentally hardened integrated circuit*

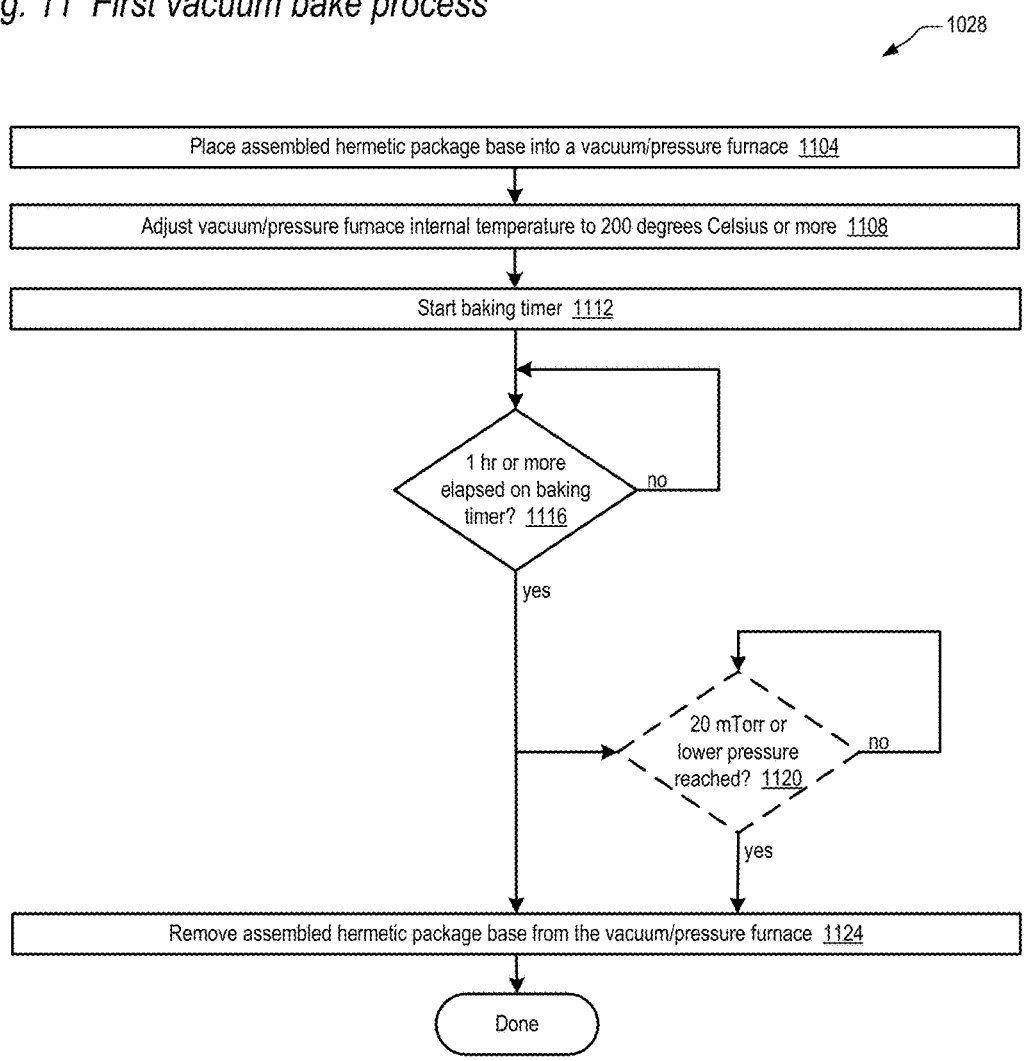
Fig. 11 First vacuum bake process

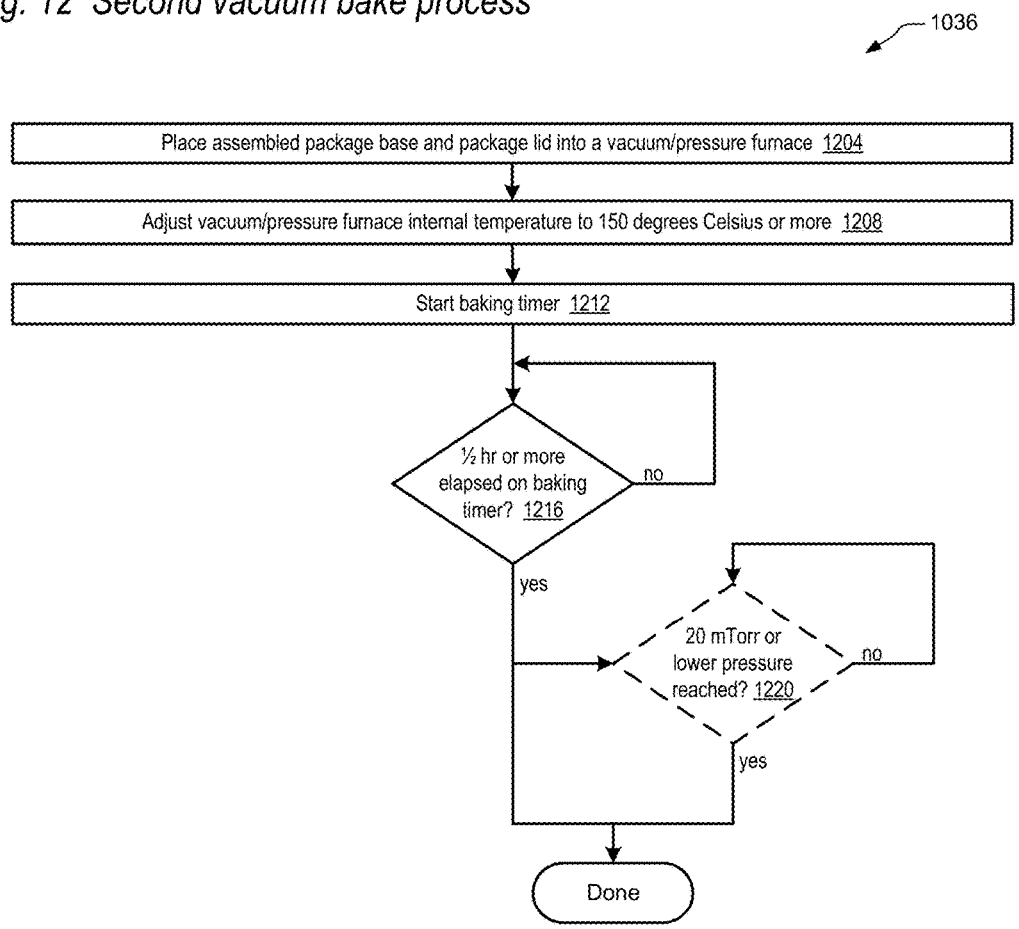
*Fig. 12 Second vacuum bake process*

INTEGRATED CIRCUIT WITH PRINTED BOND CONNECTIONS

CROSS REFERENCE TO RELATED APPLICATION(S)

This application is a Divisional of pending non-Provisional U.S. application Ser. No. 14/142,823 filed Dec. 28, 2013, entitled METHOD AND APPARATUS FOR PRINTING INTEGRATED CIRCUIT BOND CONNECTIONS, which is a Continuation-in-Part of pending U.S. application Ser. No. 13/785,959, filed Mar. 5, 2013, entitled ENVIRONMENTAL HARDENING INTEGRATED CIRCUIT METHOD AND APPARATUS, which is a Continuation-in-Part of pending U.S. application Ser. No. 13/623,603, filed Sep. 20, 2012, entitled ENVIRONMENTAL HARDENING TO EXTEND OPERATING LIFETIMES OF INTEGRATED CIRCUITS AT ELEVATED TEMPERATURES, which are hereby incorporated by reference for all purposes, which is a Continuation of U.S. application Ser. No. 13/283,293 filed Oct. 27, 2011, entitled ENVIRONMENTAL HARDENING TO EXTEND OPERATING LIFETIMES OF INTEGRATED CIRCUITS AT ELEVATED TEMPERATURES, now abandoned.

FIELD

The present invention is directed to integrated circuit packaging. In particular, the present invention is directed to integrated circuits with conformal printed bond connections.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

Integrated circuit packages generally consist of a semiconductor die placed within a package base and bonded to the base with a suitable die attach adhesive. In conventional technology, the die is electrically attached to a lead frame of the package base with discrete bond wires, which connect individual pads of the die with package leads. In most cases, the bond wires are gold, but in other environments can be copper or aluminum. Specialized equipment is required to attach the bond wires to the die pads the lead frame. Once all of the bond wires are attached, the package lid is bonded to the package base and the integrated circuit can be tested.

SUMMARY

The present invention is directed to solving disadvantages of the prior art. In accordance with embodiments of the present invention, a method for assembling a packaged integrated circuit is provided. The method includes placing a die into a cavity of a package base, securing the die to the package base with a die attach adhesive, printing a bond connection between a die pad of the die and a lead of the package base or a downbond, and sealing a package lid to the package base.

In accordance with another embodiment of the present invention, a packaged integrated circuit is provided. The packaged integrated circuit includes a die, where the die includes a plurality of die pads, a package including a base, a lid, and a plurality of package leads, and die attach adhesive, for securing the die to the package base. The die is secured to the base with the die attach adhesive. After the die is secured to the base, at least one of the plurality of die pads is electrically connected to at least one of the plurality of package leads with a printed bond connection. After printing the bond connection, the lid is sealed to the base.

In accordance with a further embodiment of the present invention, a packaged integrated circuit is provided. The packaged integrated circuit includes a die, where the die includes a plurality of die pads, and a package including a plurality of package leads. A 3D printer applies one or more printed bond conductors between the plurality of die pads and the plurality of package leads. The one or more printed bond conductors are applied by one of an extrusion, selective laser sintering, and colorjet printing process.

An advantage of the present invention is that it provides a method for packaging a die that does not require conventional bond wires. Conventional bond wires use ball bonds to couple the bond wire to either the die pads or package leads. Conventional gold and copper ball bonds are subject to various failure mechanisms known in the art, including Kirkendall voiding. Printed bond connections do not use or require ball bonds, which eliminates a point of failure for conventional bonding connections, including bond lifts, Kirkendall voiding, and heel cracks.

Yet another advantage of the present invention is it provides an improved reliability connection compared to bond wires. Bond wires have a free mass that is able to move semi-independently from the package. Independent movement places a mechanical strain on ball bonds, resulting in increased chance of stress and failure. Printed bond connections, on the other hand, are mechanically coupled to the package base along the entire length of the connection. This means less stress on the connections to die pads and package leads.

Another advantage of the present invention is it does not depend on the quality or integrity of existing ball bonds on an extracted die. The present invention creates new printed bond connections over the top of existing die pads and ball bonds. Therefore, contact is established to areas of existing die pads not covered by existing ball bonds. Even if the existing ball bonds have intermetallic weaknesses with the existing die pads, strong connections are still made to portions of the original die pads.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating a die with bond pads in accordance with embodiments of the present invention.

FIG. 2 is a diagram illustrating an extracted die with bond pads and ball bonds in accordance with embodiments of the present invention.

FIG. 3a is an illustration depicting a section of an extracted die in accordance with embodiments of the present invention.

FIG. 3b is an illustration depicting a section of an extracted die after the bond printing process in accordance with embodiments of the present invention.

FIG. 4a is an illustration depicting a conventional assembled package base using bond wires in accordance with embodiments of the conventional art.

FIG. 4b is an illustration depicting a conventional packaged integrated circuit using bond wires in accordance with embodiments of the conventional art.

FIG. 4c is an illustration depicting a conventional packaged hermetic integrated circuit using bond wires in accordance with embodiments of the conventional art.

FIG. 5a is an illustration depicting an assembled package base before bond printing in accordance with embodiments of the present invention.

FIG. 5b is an illustration depicting an assembled package base after bond insulator printing in accordance with embodiments of the present invention.

FIG. 5c is an illustration depicting an assembled package base after bond conductor printing in accordance with embodiments of the present invention.

FIG. 5d is an illustration depicting a packaged integrated circuit using printed bond conductors in accordance with embodiments of the present invention.

FIG. 5e is an illustration depicting a packaged hermetic integrated circuit using printed bond conductors in accordance with embodiments of the present invention.

FIG. 6a is an illustration depicting a top view of a die attached to a package base in accordance with embodiments of the present invention.

FIG. 6b is an illustration depicting a top view of printed bond insulators in accordance with embodiments of the present invention.

FIG. 6c is an illustration depicting a top view of printed bond conductors in accordance with embodiments of the present invention.

FIG. 7 is an illustration depicting insulating and conducting material spray with a 3D printer in accordance with the present invention.

FIG. 8 is an illustration depicting a sintering process to form a printed bond insulator or a printed bond conductor in accordance with embodiments of the present invention.

FIG. 9 is a flowchart illustrating an assembly method for an integrated circuit in accordance with the preferred embodiment of the present invention.

FIG. 10 is a flowchart illustrating an assembly method for a packaged hermetic integrated circuit using printed bond conductors in accordance with embodiments of the present invention.

FIG. 11 is a flowchart illustrating a first vacuum bake process in accordance with embodiments of the present invention.

FIG. 12 is a flowchart illustrating a second vacuum bake process in accordance with embodiments of the present invention.

DETAILED DESCRIPTION

Integrated circuits are most commonly packaged in plastic packages using dice with Aluminum (Al) bond pads and Gold (Au) bond wires from the bond pads to the package leads and package cavity. Bond wires are attached to bond pads and package leads using thermosonic bonding, wedge bonding, or other processes well understood in the art.

In some cases, bare dice are generally not available. It is therefore highly desirable to obtain dice from already packaged integrated circuits. Integrated circuit dice are then extracted from an existing package—usually plastic—and repackaged into a suitable package according to the component needs of the market. These extracted dice retain the original Au ball bonds on the Al die pads. In some cases, extracted dice are repackaged into commercial plastic packages. In other cases, often military or environmentally hardened applications, extracted dice are repackaged into hermetic ceramic or metal packages.

Several known failure mechanisms can develop with Au—Al metallic interfaces. A brief overview is discussed in Wikipedias "Gold-aluminum intermetallic", which can be found at: http://en.wikipedia.org/wiki/Gold-aluminium intermetallic. A more in-depth discussion of Gold (Au)-Aluminum (Al) intermetallics can be found in "Wire Bonding in Microelectronics", Third Edition, by George Harman—published in 2010 by McGraw-Hill, ISBN P/N 978-0-07-170101-3 and CD P/N 978-0-07-170334-5 of set 978-0-07-147623-2. Specifically, the Harman reference discusses Au—Al intermetallic compounds in Chapter 5 pages 131-153, thermal degradation in Au ball bonds on Al bond pads in Appendix 5B pages 170-173, and wire bonds in extreme temperature environments in Chapter 9 pages 330-335.

Approximately 95% of all integrated circuits utilize Au ball bonds on Al bond pads, and are plastic encapsulated. There are five Au—Al intermetallic compounds: $Au_5Al_2$, $Au_4Al$, $Au_2Al$, $AuAl_2$, and $AuAl$. Gold-Aluminum intermetallic compound formation and associated Kirkendall voids have resulted in more documented wire-bond failures than any other integrated circuit problem over the years. The $AuAl_2$ intermetallic compounds are typically referred to as "purple plague", reflecting the characteristic color that often occurs around the perimeter of an Au bond on an Al pad. The compounds grow during the curing of plastic molding compounds (typically 175° C. for 3 to 5 hours) and grow during qualification screening, burn in, stabilization bakes, or cumulatively at any time when high temperatures (above 150° C.) are encountered during the life of the device.

Bond failures result from the formation of Kirkendall voids, as well as from the susceptibility of Au—Al bonds to degradation by impurities or corrosion. Kirkendall voids form when either the Al or Au diffuses out of one region faster than it diffuses in from the other side of that region. Vacancies pile up and condense to form voids, normally on the Au-rich side. Classical Kirkendall voids require bake times greater than an hour at temperatures greater than 300° C. to occur on the Au-rich side and greater than 400° C. on the Al-rich side, or much longer times at lower temperatures. It has been observed that Kirkendall voids may form more quickly over time at elevated temperatures in packaged integrated circuits in the presence of impurities, halides, and/or moisture around the Au—Al bonds. Halides present in plastic packages contribute to significantly faster formation of Kirkendall voids relative to that of hermetic packages. In plastic packages, moisture will easily travel through the plastic package and reach the die surface, mixing with present halides and causing the IC to prematurely fail.

The well-known Arrhenius equation provides an accurate formula for predicting the rate of a chemical reaction based on temperature, and, with typical activation energies, can be generalized to state a reaction rate that roughly doubles for every 10-15 degrees Celsius increase in temperature. Therefore, it can be expected that the rate of Kirkendall void formation doubles for every 10-15 degrees Celsius increase in temperature. For example, this means that at a temperature of 200° C., Kirkendall voids can form on average 32 times faster than at 150° C. Increasingly high temperatures significantly reduce component lifetime based in accelerated growth of intermetallic weaknesses.

The present invention is directed to the problems associated with conventional bond wires and ball bonds. The first problem involves weaknesses at the ball bonds themselves, as discussed above. The second problem is due to the construction of a free-mass bond wire itself, which is mechanically unsupported between the die pad and the package lead. Because this free mass is unsupported, shock and vibration imparted to the package itself causes a different acceleration of the bond wire compared to the package, resulting in mechanical strain at both ends of the bond wire. Over time, this may contribute to mechanical separation of the bond wire from either the ball bond, die pad, or the package lead. The third problem is simply the high cost of Gold (Au) bond wires—which by some estimates are expected to increase dramatically in future years due to market forces that affect the price of Gold itself. In all types of integrated circuits, therefore, it is desirable to replace conventional bond wires with an interconnect system with better cost and reliability.

Referring now to FIG. 1, a diagram illustrating a die 100 with original die pads 104 in accordance with embodiments of the present invention is shown. Die 100 is an individual semiconductor die or substrate, and is usually fabricated in suitable technologies including Silicon (Si) and Gallium Arsenide (GaAs). Die 100 may have a single die or multiple interconnected dice. Regardless whether die 100 includes a single die or multiple interconnected dice, die circuitry is connected to original die pads 104 of the die 100. Original die pads 104 are aluminum (Al) or copper (Cu) alloy pads.

Referring now to FIG. 2, a diagram illustrating an extracted die 200 with bond pads 104, 208 and ball bonds 204 in accordance with embodiments of the present invention is shown. Each previously used original die pad 104 of the extracted die 100 may have a single original gold ball bond 204 present, although some un-bonded die pads 208 may not have an original ball bond 204 present. In some cases, this is due to a no-connect in the previous package. When the extracted die 200 was present in whatever previous package was used for the extracted die 200, bond wires connected each of the original ball bonds 204 to a lead or a downbond of the previous package. FIG. 2 illustrates the extracted die 200, after it has been removed from the previous package. Therefore, bond wires have been removed and only original ball bonds 204 remain. In current technology packaged integrated circuits, the vast majority of bond wire interconnections are made with Au thermosonic ball bonding. Extracted dice 200 are in the state shown in FIG. 2 at the beginning of the process of the present invention. Section A-A is used in FIG. 3a to illustrate a side view of extracted die 200.

Referring now to FIG. 3a, an illustration depicting a section of an extracted die 200 in accordance with embodiments of the present invention is shown. Extracted die 200 includes a die substrate 304 supporting a passivation layer 308 and die pads 104, 208. Extracted die 200 includes a plurality of Al die pads 104, which include an original ball bond 204. Extracted die 200 also includes a plurality of Al die pads 208, which do not include an original ball bond 204.

Referring now to FIG. 3b, an illustration depicting a section of an extracted die 200 after a bond printing process in accordance with embodiments of the present invention is shown. Extracted die 200 is the same as extracted die 200 of FIG. 3a, and the same references identified in FIG. 3a apply to FIG. 3b. FIG. 3b illustrates printed bond conductors 312 over each of the Al die pad 104/original ball bond 204 and Al die pad 208. It should be noted that a printed bond conductor 312 is only required where a bond wire is required, and there may be some instances where an Al die pad 104/original ball bond 204 or Al die pad 208 does not have a printed bond conductor 312, and instead appears as shown in FIG. 3a. The process of applying printed bond conducts 312 is illustrated in more detail in FIGS. 4-8.

Referring now to FIG. 4a, an illustration depicting a conventional assembled package base 400 using bond wires 420 in accordance with embodiments of the conventional art is shown.

The assembled package base 400 includes a package base 404. In one embodiment, the package base 404 is a non-hermetic package base 404. In another embodiment, the package base 404 is a hermetic package base 404. In non-hermetic applications, package base 404 is generally plastic. If the package base 404 is a hermetic package base 404, it may be formed from ceramic, metal, or glass materials. The package base 404 includes a cavity 408 into which a die 100 or extracted die 200 is placed.

Die attach adhesive 412 is applied to the package base 404 such that when the die 100, 200 is inserted into the package base cavity 408, the die attach adhesive 412 makes simultaneous contact with both the package base 404 and the die 100, 200. In embodiments where the package base 404 is a component of a hermetic package 432, die attach adhesive 412 is a low-halide compound adhesive, where a low halide compound has less than 10 parts per million (ppm) halide. Die attach adhesive 412 therefore bonds the die 100, 200 to the package base 404, and protects the integrity of the interior of the assembled package base 400. It has been well established that halogens in an Au—Al bond interface degrade Au—Al bond strength since out-gassed products from adhesives containing halogens rapidly corrode Al metallization in integrated circuits at high temperatures, thus reducing product lifetime at high temperatures.

Associated with the package base 404 are a series of package leads 416, which provide interconnection between circuitry of the die 100, 200 and circuitry of a printed circuit board on which the integrated circuit is eventually mounted. For example, if an SO-24 ceramic package is used for the integrated circuit, 24 package leads 416 would be present, configured as 12 package leads 416 on each of two opposite sides of the package base 404. If a PLCC-68 ceramic package is used for the integrated circuit, 68 package leads 416 would be present, configured as 17 package leads 416 on each of the four sides of the package base 404.

After mounting the die 100, 200 into the package base 404 using die attach adhesive 412, bond wires 420 are then attached between die pads 104, 208 and package leads 416. Bond wires 420 are commonly 1-3 mils in diameter, but may be any usable diameter. A new ball bond is formed on top of die pads 104, where a previous ball bond exists. In a preferred embodiment, bond wires 420 are Gold (Au) bond wires. In other embodiments, bond wires 420 are Aluminum (Al) or Copper (Cu) bond wires.

For a hermetic package including a hermetic package base 404, once all bond wires 420 are bonded between package leads 416 and die 100, 200 or downbonds to the package cavity 408, the assembled package base 400 including die 100, 200, die attach adhesive 412, package base 404, package leads 416, and bond wires 420, is first vacuum baked according to the process of FIG. 11.

Referring now to FIG. 4b, an illustration depicting a conventional packaged integrated circuit 424 using bond wires 420 in accordance with embodiments of the conventional art is shown. Packaged integrated circuit 424 is assembled package base 400 with a package lid 428 attached. In non-hermetic applications, package lid 428 is generally plastic.

Referring now to FIG. 4c, an illustration depicting a conventional packaged hermetic integrated circuit 432 using bond wires 420 in accordance with embodiments of the conventional art is shown. Packaged hermetic integrated circuit 432 includes the assembled hermetic package base 400 of FIG. 4a and additional components described below.

Following the first vacuum bake process of FIG. 11, a hermetic package lid 428 is attached to the assembled hermetic package base 400. If the package lid 428 is a hermetic package lid 428, it may be formed from ceramic, metal, or glass materials.

A moisture getter 444 is present within the hermetic integrated circuit 432. The moisture getter 444 is a compound that absorbs moisture within the hermetic integrated circuit 432 after the package 432 has been hermetically sealed. By absorbing moisture that rapidly weakens Au—Al bonds at temperatures over 175° C., the predominant high temperature failure mechanism is minimized within the hermetic integrated circuit 432. An example of a moisture getter 444 is Cookson Group STAYDRY® SD1000, which is a paste formulation high-temperature moisture getter 444 intended for high reliability applications. In a preferred embodiment, moisture getter 444 is applied to the interior surface of the package lid 428 using a deposition process, where uniform thickness of three or more microns of moisture getter 444 is applied.

A sealing material 436 is present between the assembled hermetic package base 400 and the hermetic package lid 428 to produce a hermetic seal at the end of a second vacuum bake process, which is illustrated in FIG. 12. In one embodiment, sealing material 436 is applied to the hermetic package lid 428 prior to attaching the hermetic package lid 428 to the assembled hermetic package base 400. In one embodiment, the sealing material 436 is sealing glass. In another embodiment, the sealing material 436 is an epoxy. In a third embodiment, the sealing material 436 is a solder compound.

In conjunction with the second vacuum bake process of FIG. 12, a noble gas 440 is injected into the interior of the hermetic integrated circuit 432. Noble gas 440 injection occurs prior to sealing the hermetic package lid 428 to the assembled hermetic package base 400, but during the second vacuum bake process. In one embodiment, noble gas 440 is Argon. In other embodiments, noble gas 440 includes any one of Helium (He), Neon (Ne), Krypton (Kr), Xenon (Xe), and Radon (Rn). Noble gases 440 pressurize the hermetic integrated circuit 432 such that over temperatures of −55° C. to 250° C., the internal pressure of the hermetic integrated circuit 432 is maintained between 0.1 ATM and 2 ATM, preferably 1 ATM. This minimizes pressure-caused stress to the hermetic integrated circuit 432, and especially stress to the sealing material 436. Noble gases 440 are used in preference to other gases since noble gases 440 are inert and do not react with the moisture getter 444. In one embodiment, the noble gas 440 is injected into the cavity 408 to a pressure of between 0.1 to 2 Atmospheres (ATM), preferably 1 ATM, at a temperature between 200° C. and 275° C., preferably 255° C.

Referring now to FIG. 5a, an illustration depicting an assembled package base 504 before bond printing in accordance with embodiments of the present invention is shown. Assembled package base 504 is the same as assembled package base 400, with the exception that no bond wires 420 are present. In one embodiment, the package base 504 is a non-hermetic package base 504. In another embodiment, the package base 504 is a hermetic package base 504. If the package base 504 is a hermetic package base 504, it may be formed from ceramic, metal, or glass materials. The package base 504 includes a cavity 408 into which a die 100 or extracted die 200 is placed.

Referring now to FIG. 5b, an illustration depicting an assembled package base after bond insulator printing 508 in accordance with embodiments of the present invention is shown. Assembled package base after bond insulator printing 508 is the same as assembled package base 504, with the exception that one or more printed bond insulators 512 are present. Printed bond insulators 512 are printed between die pads 104, 208 and package leads 416 to prevent electrical conduction between any of the package base 404, die attach adhesive 412, and non-pad areas of the die 100, 200 and a printed bond conductor 520. Printed bond insulator 512 thickness can be less than 2 microns and is preferably 0.5-1 microns Printed bond insulators 512 are not printed over die pads 104, 208 and package leads 416, as that would inhibit conduction. For example, if the package base 404 is metal, a printed bond conductor 520 would short to the package base 404—thereby rendering the integrated circuit 424, 432 inoperable. The printing process for the printed bond insulators 512 is described in more detail with respect to FIGS. 7 and 8 and the accompanying description.

Referring now to FIG. 5c, an illustration depicting an assembled package base after bond conductor printing 516 in accordance with embodiments of the present invention is shown. Printed bond conductors 520 are printed after printed bond insulators 512 since the printed bond conductors 520 are printed on top of the printed bond insulators 512. Printed bond conductor 520 thickness can be less than 2 microns and is preferably 0.5-1 microns It is understood that printed bond conductors 520 must be formulated to always adhere reliably to die pads 104, 208 and package leads 416. In some embodiments, it may be possible to only print printed bond conductors 520, and not printed bond insulators 512. Such cases include printing where a package base 404 is plastic or another non-conductive material. However, in those cases it is important that the printed bond conductors 520 be formulated in order to reliably adhere to non-conducting surfaces of the die 100, 200, the die attach adhesive 412, and the package base 404. The printing process for the printed bond conductors 520 is described in more detail with respect to FIGS. 7 and 8 and accompanying description.

Referring now to FIG. 5d, an illustration depicting a packaged integrated circuit using printed bond conductors 524 in accordance with embodiments of the present invention is shown. Packaged integrated circuit 524 is assembled package base 516 with a package lid 428 attached. In the embodiment illustrated in FIG. 5d, package lid 428 is non-hermetic and is generally plastic.

Referring now to FIG. 5e, an illustration depicting a packaged hermetic integrated circuit using printed bond conductors 528 in accordance with embodiments of the present invention is shown. Packaged hermetic integrated circuit 528 includes the assembled hermetic package base 516 of FIG. 5c and additional components described below.

Following the first vacuum bake process of FIG. 11, a hermetic package lid 428 is attached to the assembled hermetic package base 516. The hermetic package lid 428 may be formed from ceramic, metal, or glass materials.

A moisture getter 444 is present within the hermetic integrated circuit 528. The moisture getter 444 is a compound that absorbs moisture within the hermetic integrated circuit 528 after the package has been hermetically sealed. By absorbing moisture that rapidly weakens Au—Al bonds at temperatures over 175° C., the predominant high temperature failure mechanism is minimized within the hermetic integrated circuit 528. An example of a moisture getter 444 is Cookson Group STAYDRY® SD1000, which is a paste formulation high-temperature moisture getter 444 intended for high reliability applications. In a preferred embodiment, moisture getter 444 is applied to the interior surface of the package lid 428 using a deposition process, where uniform thickness of three or more microns of moisture getter 444 is applied.

A sealing material 436 is present between the assembled hermetic package base 516 and the hermetic package lid 428 to produce a hermetic seal at the end of a second vacuum bake process, which is illustrated in FIG. 12. In one embodiment, sealing material 436 is applied to the hermetic package lid 428 prior to attaching the hermetic package lid 428 to the assembled hermetic package base 516. In one embodiment, the sealing material 436 is sealing glass. In another embodiment, the sealing material 436 is an epoxy. In a third embodiment, the sealing material 436 is a solder compound.

In conjunction with the second vacuum bake process of FIG. 12, a noble gas 440 is injected into the interior of the hermetic integrated circuit 528. Noble gas 440 injection occurs prior to sealing the hermetic package lid 428 to the assembled hermetic package base 516, but during the second vacuum bake process. In one embodiment, noble gas 440 is Argon. In other embodiments, noble gas 440 includes any one of Helium (He), Neon (Ne), Krypton (Kr), Xenon (Xe), and Radon (Rn). Noble gases 440 pressurize the hermetic integrated circuit 528 such that over temperatures of −55° C. to 250° C., the internal pressure of the hermetic integrated circuit 432 is maintained between 0.1 ATM and 2 ATM, preferably 1 ATM. This minimizes pressure-caused stress to the hermetic integrated circuit 528, and especially stress to the sealing material 436. Noble gases 440 are used in preference to other gases since noble gases 440 are inert and do not react with the moisture getter 444. In one embodiment, the noble gas 440 is injected into the cavity 408 to a pressure of between 0.1 to 2 Atmospheres (ATM), preferably 1 ATM, at a temperature between 200° C. and 275° C., preferably 255° C.

Referring now to FIG. 6a, an illustration depicting a top view of a die 100, 200 attached to a package base 404 in accordance with embodiments of the present invention is shown. The die 100, 200 is securely mounted in the package base cavity 408 with die attach adhesive 412. The package base 404 has a plurality of package base bond pads 604, which provide a conduction path to the leads 416 on the exterior of the package base 404. One package lead 416 is provided on the exterior of the package base 404 for every package base bond pad 604.

Referring now to FIG. 6b, an illustration depicting a top view of printed insulators 512 in accordance with embodiments of the present invention is shown. Printed bond insulators 512 are printed between die pads 104, 208 and package base bond pads 604 to prevent electrical conduction between any of the package base 404, die attach adhesive 412, and non-pad areas of the die 100, 200 and a printed bond conductor 520.

As shown in FIG. 6b. the printed bond insulators 512 are printed over areas of the die 100, 200, die attach adhesive 412, and the package base 404 between die pads 104, 208 and package base bond pads 604. Although printed bond insulators 512 are generally not applied over die pads 104, 208 or package base bond pads 604, a small amount of overlap with either is acceptable as long as sufficient area is available for printed bond conductors 520 to make effective electrical contact with die pads 104, 208 or package base bond pads 604.

Referring now to FIG. 6c, an illustration depicting printed bond conductors 520 in accordance with embodiments of the present invention is shown. Printed bond conductors 520 are printed between die pads 104, 208 and package leads 416, and cover at least portions of die pads 104, 208 and package base bond pads 604. Printed bond conductors 520 are printed over printed bond insulators 512 in such a way that the printed bond conductors do not make contact with any other conducting material of the package base 404 or die 100, 200.

Referring now to FIG. 7, an illustration depicting insulating and conducting material spray with a 3D printer in accordance with the present invention is shown. 3D printers are able to precisely deposit insulating or conducting material on complex shapes, and are able to build up or layer the insulating or conducting material to a precise thickness.

The 3D printer includes a 3D printer conductive material spray head 704, which applies bond insulator material 712 or bond conductor material 716 to selected areas of the assembled package base 504. 3D printers typically deposit material in layers, and build up a desired thickness of material by depositing multiple layers. The 3D printer is computer controlled equipment, and sprays material according to a file or files prepared beforehand designating specific locations that material will be applied to.

In one embodiment, the 3D printer uses an extrusion process to apply either the bond insulator material 712 or the bond conductor material 716, or both. The extrusion process, sometimes referred to as Fused Deposition Modeling (FDM) uses a heated nozzle to extrude molten material.

In another embodiment, the 3D printer uses a Colorjet Printing (CJP) process to apply either the bond insulator material 712 or the bond conductor material 716, or both. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In the preferred embodiment, the 3D printer uses a selective laser sintering process. Either bond insulator material 712 or bond conductor material 716 is applied in powder form to the assembled package base 504.

The bond insulator material 712 is a material able to be applied in powder form or extruded, and is generally a polymer or plastic. However, any material having suitable insulation properties, able to adhere to the assembled package base 504, and able to be applied with a 3D printer material spray head 704 is suitable as bond insulator material 712.

The bond conductor material 716 is also a material able to be applied in powder form or extruded, and includes at least conductive metal and possibly polymer or plastic content in order to provide elastomeric or resilient properties. In the preferred embodiment, the metal content is silver. In other embodiments, the material may include alone or in combination gold, aluminum, or copper.

Referring now to FIG. 8, an illustration depicting a sintering process to form a printed bond insulator 512 or a printed bond conductor 520 in accordance with embodiments of the present invention is shown. The sintering process is a second step of the 3D printing process used in the preferred embodiment of the invention. A laser 804 aims a laser beam 808 at the applied bond insulator material 712 or bond conductor material 716 to convert the applied material 712, 716 into a printed bond insulator 512 or a printed bond conductor 520, respectively. The laser beam 808 converts the powder form applied material 712, 716 into a molten compound with liquid properties that forms a smooth solid compound when it cools. The smooth solid compound is either the printed bond insulator 512 or printed bond conductor 520.

Referring now to FIG. 9, a flowchart illustrating an assembly method for an integrated circuit 524 in accordance with the preferred embodiment of the present invention is shown. Flow begins at block 904.

At block 904, a die attach adhesive 412 is applied to the package base cavity 408. The die attach adhesive 412 acts as a glue between the die 100, 200 in the package base 404, thereby eliminating movement of the die 100, 200 relative to the package base 404. Flow proceeds to block 908.

At block 908, the die 100 or extracted die 200 is placed into the package base cavity 408. A majority of the bottom surface of the die 100 or extracted die 200 makes contact with the die attach adhesive 412 in order to make a strong connection. Flow proceeds to block 912.

At block 912, a 3D printer applies bond insulator material 712 to the package base 404 between die pads 104, 208 and package base bond pads 604. This process is described in more detail with reference to FIG. 7. The bond insulator material 712 is applied with a sufficient width and thickness to allow a subsequent application of bond conductor material 716 over the bond insulator material 712 without the bond conductor material 716 making contact with the package base 404, die attach adhesive 412, or non-die pad 104, 208 areas of the die 100, 200. Flow proceeds to block 916.

At block 916, printed bond insulators 512 are created by sintering the bond insulator material 712 with a laser beam, as described with reference to FIG. 8. The sintering process fuses the bond insulator material 712 together in a uniform manner, producing reliable printed bond insulators 512. Flow proceeds to block 920.

At block 920, the 3D printer applies bond conductor material 716 over the printed bond insulators 512, between and electrically interconnecting the die pads 104, 208 and the package base bond pads 604. This process is described in more detail with reference to FIG. 7. The bond conductor material 716 is applied with a sufficient width and thickness to allow for similar electrical conduction and resistivity as bond wires 420. In one embodiment, a single layer of bond conductor material 716 is applied. In other embodiments, two or more layers of bond conductor material 716 are applied. Flow proceeds to block 924.

At block 924, printed bond conductors 520 are created by sintering the bond conductor material 716 with a laser beam, as described with reference to FIG. 8. The sintering process fuses the bond conductor material 716 together in a uniform manner, producing reliable printed bond conductors 520. Flow proceeds to block 928.

At block 928, the assembled package base 516 is removed from the 3D printer apparatus and the package lid 428 is placed on the assembled package base 516. The package lid 428 is placed in proper orientation such that the combination of the package lid 428 and the assembled package base 516 is sealed following block 928. Flow proceeds to optional block 932 and block 936.

At optional block 932, the package leads 416 are trimmed, if necessary. In some embodiments, the package leads 416 are already trimmed in the package base 404, and do not need to be trimmed. If the package leads 416 do need to be trimmed, they are trimmed per customer requirements. Flow proceeds to block 936.

At block 936, the packaged integrated circuit 524 is electrically tested. Electrical testing includes continuity tests or functional tests, or both. If the packaged integrated circuit 524 has passed the electrical tests, and the package leads 416 are properly trimmed, the packaged integrated circuit 524 is marked and is a complete integrated circuit 524 ready for use. Flow ends at block 936.

Referring now to FIG. 10, a flowchart illustrating an assembly method for a packaged hermetic integrated circuit 528 using printed bond conductors 520 in accordance with embodiments of the present invention is shown. Flow begins at block 1004.

At block 1004, a low-halide content die attach adhesive 412 is applied to the hermetic package base cavity 408. The die attach adhesive 412 acts as a glue between the die 100, 200 in the hermetic package base 404, thereby eliminating movement of the die 100, 200 relative to the hermetic package base 404. A low-halide content die attach adhesive 412 is used in order to reduce impurities that may degrade bonds to die pads 104, 208 or package base bond pads 604. Flow proceeds to block 1008.

At block 1008, the die 100 or extracted die 200 is placed into the hermetic package base cavity 408. A majority of the bottom surface of the die 100 or extracted die 200 makes contact with the low-halide content die attach adhesive 412 in order to make a strong connection. Flow proceeds to block 1012.

At block 1012, a 3D printer applies bond insulator material 712 to the hermetic package base 404 between die pads 104, 208 and package base bond pads 604. This process is described in more detail with reference to FIG. 7. The bond insulator material 712 is applied with a sufficient width and thickness to allow a subsequent application of bond conductor material 716 over the bond insulator material 712 without the bond conductor material 716 making contact with the hermetic package base 404, die attach adhesive 412, or non-die pad 104, 208 areas of the die 100, 200. Flow proceeds to block 1016.

At block 1016, printed bond insulators 512 are created by sintering the bond insulator material 712 with a laser beam, as described with reference to FIG. 8. The sintering process fuses the bond insulator material 712 together in a uniform manner, producing reliable printed bond insulators 512. Flow proceeds to block 1020.

At block 1020, the 3D printer applies bond conductor material 716 over the printed bond insulators 512, between and electrically interconnecting the die pads 104, 208 and the package base bond pads 604. This process is described in more detail with reference to FIG. 7. The bond conductor material 716 is applied with a sufficient width and thickness to allow for similar electrical conduction and resistivity as bond wires 420. In one embodiment, a single layer of bond conductor material 716 is applied. In other embodiments, two or more layers of bond conductor material 716 are applied. Flow proceeds to block 1024.

At block 1024, printed bond conductors 520 are created by sintering the bond conductor material 716 with a laser beam, as described with reference to FIG. 8. The sintering process fuses the bond conductor material 716 together in a uniform manner, producing reliable printed bond conductors 520. Flow proceeds to block 1028.

At block 1028, the assembled hermetic package base 516 is first vacuum baked. The assembled hermetic package base 516 includes the hermetic package base 404, package leads 416, the die 100, 200, the die attach adhesive 412, and the printed bond insulators and conductors 512, 520. The process of first vacuum baking is illustrated in FIG. 11. Flow proceeds to block 1032.

At block 1032, the assembled hermetic package base 516 is removed from the vacuum baking apparatus and the hermetic package lid 428 is placed on the assembled hermetic package base 516. The hermetic package lid 428 is placed in proper orientation such that the combination of the hermetic package lid 428 and the assembled hermetic package base 516 is hermetically sealed following block 1048. A moisture getter 444 is applied to the interior of the hermetic package lid 428. In a preferred embodiment, the moisture getter 444 is uniformly applied with a thickness of three or more microns to the interior surface of the hermetic package lid 428 using a deposition process. Flow proceeds to block 1036.

At block 1036, the assembled hermetic package base 516 and hermetic package lid 428 are placed into the vacuum baking apparatus and second vacuum baked. Unlike block 1028, where only the assembled hermetic package base 516 is first vacuum baked, block 1036 requires the hermetic package lid 428 to be placed on the assembled hermetic package base 516 prior to initiating the second vacuum bake process. The second vacuum bake process is illustrated in FIG. 12. Flow proceeds to block 1040.

At block 1040, a vacuum pump in the vacuum baking apparatus is turned off. Turning the vacuum pump off prevents gases from being evacuated from the vacuum baking apparatus, and is required in order for noble gas 440 injected in block 1044 to remain in the packaged hermetic integrated circuit 528 after the hermetic package lid 428 is sealed to the assembled hermetic package base 516. Flow proceeds to block 1044.

At block 1044, a noble gas 440 is injected into the packaged hermetic integrated circuit 528, while the packaged hermetic integrated circuit 528 is in the vacuum baking apparatus, and immediately following the second vacuum bake process. In a preferred embodiment, the noble gas 440 is Argon, and the noble gas 440 is injected into the cavity 408 to a pressure of between 0.1 to 2 Atmospheres (ATM), preferably 1 ATM, at a temperature between 200° C. and 275° C., preferably 255° C. Flow proceeds to block 1048.

At block 1048, the hermetic package lid 428 is sealed to the assembled hermetic package base 516 to create a packaged hermetic integrated circuit 528. A sealing material 436 known in the art between the hermetic package lid 428 and the hermetic package base 404 is activated at a specific temperature corresponding to the type of sealing material 436 used within the vacuum baking apparatus. Once sealing is completed, the noble gas 440 is present within the packaged hermetic integrated circuit 524 and is pressurized at the level specified in block 1044. Flow continues to block 1052.

At block 1052, the packaged hermetic integrated circuit 524 is removed from the vacuum baking apparatus and is tested for hermeticity per MIL-SPEC-883H. In one embodiment, flow proceeds to block 1060. In a second embodiment, flow proceeds to optional block 1056.

At optional block 1056, the package leads 416 are trimmed, if necessary. In some embodiments, the package leads 416 are already trimmed in the hermetic package base 404, and do not need to be trimmed. If the package leads 416 do need to be trimmed, they are trimmed per customer requirements. Flow proceeds to block 1060.

At block 1060, the packaged hermetic integrated circuit 528 is electrically tested. Electrical testing includes either continuity tests or functional tests, or both. If the packaged hermetic integrated circuit 528 has passed the hermeticity and electrical tests and the package leads 416 are properly trimmed to the appropriate length, the packaged hermetic integrated circuit 528 is marked and is a complete hermetic integrated circuit 528 ready for use. Flow ends at block 1060.

Referring now to FIG. 11, a flowchart illustrating a first vacuum bake process 1028 in accordance with embodiments of the present invention is shown. Flow begins at block 1104.

At block 1104, the assembled hermetic package base 516 is placed into a vacuum/pressure furnace. The vacuum/pressure furnace is equipment designed to present a predetermined thermal profile to one or more integrated circuits at a fixed or varying atmospheric pressure profile. Examples of vacuum/pressure furnaces are models 3130, 3140, and 3150 produced by Scientific Sealing Technologies International (SST). Flow proceeds to block 1108.

At block 1108, the internal temperature of the vacuum/pressure furnace is adjusted to a temperature of 200° C. or more. Flow proceeds to block 1112.

At block 1112, a baking timer is started. The baking timer measures elapsed time the assembled hermetic package base 516 is baking in the vacuum/pressure furnace. Flow proceeds to decision block 1116.

At decision block 1116, the baking timer is evaluated to determine if the assembled hermetic package base 516 has been baking for one hour, or more. If the assembled hermetic package base 516 has not been baking for at least one hour, then flow proceeds to decision block 1116 to wait until at least one hour of baking time has elapsed. In a first embodiment, if the assembled hermetic package base 516 has been baking for at least one hour, then flow proceeds to block 1124. In a second embodiment, if the assembled hermetic package base 516 has been baking for at least one hour, then flow proceeds to optional decision block 1120.

At optional decision block 1120, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, the flow proceeds to block 1120 to wait until at least a baking pressure of 20 mTorr or less has been reached. If a baking pressure of 20 mTorr or less has been reached, the flow proceeds to block 1124.

At block 1124, the assembled hermetic package base 516 is removed from the vacuum/pressure furnace. The first vacuum baking process is now completed. Flow proceeds to block 1032 of FIG. 10.

Referring now to FIG. 12, a flowchart illustrating a second vacuum bake process 1036 in accordance with embodiments the present invention is shown. Although a second vacuum bake process may not always be required, it is performed in the preferred embodiment of the present invention for hermetic integrated circuits 528. Flow begins at block 1204.

At block 1204, the assembled hermetic package base 516 and hermetic package lid 428 is placed into the vacuum/pressure furnace. Flow proceeds to block 1208.

At block 1208, the internal temperature of the vacuum/pressure furnace is adjusted to a temperature of 150° C. or more. Flow proceeds to block 1212.

At block 1212, a baking timer is started. The baking timer measures elapsed time the assembled hermetic package base 516 and hermetic package lid 428 is baking in the vacuum/pressure furnace. Flow proceeds to decision block 1216.

At decision block 1216, the baking timer is evaluated to determine if the assembled hermetic package base 516 and hermetic package lid 428 has been baking for one half hour, or more. If the assembled hermetic package base 516 and hermetic package lid 428 has not been baking for at least one half hour, then flow proceeds to decision block 1216 to wait until at least one half hour of baking time has elapsed. In one embodiment, if the assembled hermetic package base 516 and hermetic package lid 428 has been baking for at least one half hour, then flow proceeds to block 1040 of FIG. 10. In a second embodiment, if the assembled hermetic package base 516 and hermetic package lid 428 has been baking for at least one half hour, then flow proceeds to optional decision block 1220.

At optional decision block 1220, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, then flow proceeds to optional block 1220 to wait until at least a baking pressure of 20 mTorr or less has been reached. If a baking pressure of 20 mTorr or less has been reached, then flow proceeds to block 1040 of FIG. 10.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A packaged integrated circuit comprising:
   a die, the die comprising a plurality of die pads;
   a package comprising a base, a lid, and a plurality of package leads; and
   a die attach adhesive, for securing the die to the package base;
   wherein the die is secured to the package base with the die attach adhesive, wherein after the die is secured to the package base, all connections between die pads and package leads are provided by sprayed bond connections conformal to the die and an interior surface of the package base, each sprayed bond connection comprising a plurality of layers with a total thickness of at least 0.5 microns, wherein the sprayed bond connections cover at least one existing ball bond on the die pads, wherein a bond wire is not attached to the at least one existing ball bond, wherein after spraying the bond connections, the lid is sealed to the package base.

2. The packaged integrated circuit as recited in claim 1, wherein the sprayed bond connections comprises sprayed bond conductors, wherein the sprayed bond conductors are applied to the package base by one of an extrusion printing process, a selective laser sintering process, and a colorjet printing process.

3. The packaged integrated circuit as recited in claim 2, wherein the sprayed bond insulators are a polymer material that prevents electrical conduction between the sprayed bond conductors and any of the package base, the package lid, and the die attach adhesive, wherein a 3D printer applies the sprayed bond insulators between die pads and package leads.

4. The packaged integrated circuit as recited in claim 2, wherein the sprayed bond conductors comprises an elastomeric material and at least one of gold, aluminum, copper, and silver, wherein a 3D printer applies the sprayed bond conductors.

5. The packaged integrated circuit as recited in claim 4, wherein the sprayed bond conductors are sprayed over the sprayed bond insulators, wherein each sprayed bond conductor makes electrical contact between at least one die pad and at least one package lead.

6. The packaged integrated circuit as recited in claim 1, wherein the sprayed bond connections comprises sprayed bond insulators and sprayed bond conductors.

7. A packaged integrated circuit comprising:
   a die, the die comprising a plurality of die pads; and
   a package comprising a plurality of package leads and a package base;
   wherein a 3D printer provides all electrical connections between die pads and package leads by spraying sprayed bond conductors, each in a plurality of layers to a minimum thickness of 0.5 microns between the die pads and the package leads, wherein the sprayed bond conductors conform to a surface of the die and an interior surface of the package base and are applied by one of an extrusion, selective laser sintering, and colorjet printing process, wherein at least one of the sprayed bond conductors covers an existing ball bond on the die pads, wherein a bond wire is not attached to the existing ball bond.

8. The packaged integrated circuit as recited in claim 7, wherein the sprayed bond conductors comprises at least one of gold, aluminum, copper, and silver, wherein the sprayed bond conductors provides electrical conduction paths between the die pads and the package leads.

9. The packaged integrated circuit as recited in claim 7, wherein prior to spraying the sprayed bond conductors, the 3D printer sprays sprayed bond insulators, wherein at least one sprayed bond conductor is applied over a sprayed bond insulator.

10. The packaged integrated circuit as recited in claim 7, wherein the sprayed bond insulators are a polymer material, wherein a 3D printer sprays the sprayed bond insulators between die pads and package leads.

* * * * *